United States Patent [19]
Ikeya et al.

[11] Patent Number: 5,690,281
[45] Date of Patent: Nov. 25, 1997

[54] SOCKET APPARATUS

[75] Inventors: Kiyokazu Ikeya, Shizuoka-ken; Kiyoshi Adachi, Hiratsuka; Masao Tohyama; Tomohiro Nakano, both of Gotemba, all of Japan

[73] Assignee: Texas Instruments Incorporated, Dallas, Tex.

[21] Appl. No.: 518,123

[22] Filed: Aug. 22, 1995

[30] Foreign Application Priority Data

Aug. 23, 1994 [JP] Japan ................................ 6-221083

[51] Int. Cl.$^6$ ............................................. H01R 11/22
[52] U.S. Cl. ............................................ 439/268
[58] Field of Search ........................ 439/259, 263–265, 439/266, 268

[56] References Cited

U.S. PATENT DOCUMENTS

| | | | |
|---|---|---|---|
| 3,763,459 | 10/1973 | Millis | 339/75 M |
| 4,147,213 | 4/1979 | Funk et al. | 439/266 |
| 4,509,812 | 4/1985 | Lotter | 339/75 M |
| 4,531,792 | 7/1985 | Oshitani et al. | 439/264 |
| 5,123,855 | 6/1992 | Petersen | 439/263 |
| 5,247,250 | 9/1993 | Rios | 324/158 |
| 5,419,710 | 5/1995 | Pfaff | 439/266 |
| 5,456,613 | 10/1995 | Mc Hugh | 439/268 |

FOREIGN PATENT DOCUMENTS 0 613 335   8/1994   European Pat. Off. .

OTHER PUBLICATIONS

Co-Pending Patent Application Serial No. 08/197,437 filed Feb. 16, 1994.

Patent Abstracts of Japan, vol. 9, No. 19 (E-292), 25 Jan. 1985, JP 59-165 442 (Yamaichi).

*Primary Examiner*—Neil Abrams
*Assistant Examiner*—Brian J. Biggi
*Attorney, Agent, or Firm*—Russell E. Baumann; Richard L. Donaldson; Rene' E. Grossman

[57]   ABSTRACT

A socket having a structure which is suitable for electrical connection with ball-shaped lead terminals of an IC package is shown. When a cover (12) is pushed down, a latch (70) moves away, a slide plate (40) slides toward the positive side in an X direction through levers (52) and (50) and movable shaft (58) and both arms of each contact maker (30) open. Each lead terminal (solder ball) (32a) of the BGA package (32) is freely inserted between both arms of a respective contact maker (30) when in the open state. When cover (12) rises to its highest position, slide plate (40) slides in the reverse direction by the spring force of a compression coil spring, thereby returning to the its original position and both arms of each contact (32) engage each lead terminal (32a) in such a way as to hold it from opposite sides with a result that an electrical connection based on compressive engagement is obtained between each contact element (30) and each respective terminal (32a).

13 Claims, 22 Drawing Sheets

SOCKET APPARATUS

FIELD OF THE INVENTION

This invention relates to a socket for removably loading an electric part having a large number of lead terminals in order to effect an electrical connection with each lead terminal.

BACKGROUND OF THE INVENTION

At semiconductor manufacturing plants, it is generally the case that an IC package comprising a plastic encapsulated semiconductor integrated circuit chip (which will hereafter be referred to as an IC chip) is subjected to an electrical property test or a reliability test called a burn-in test prior to its shipment in order to separate good from bad product. The electrical property test is carried out for the purpose of inspecting the input-output characteristics, pulse characteristics, noise leeway, and the like of the IC chips. In the burn-in test, the IC packages which pass the electrical property test are placed in an oven and operated for a certain period of time under an electric voltage source which is larger than the rated value by approximately 20 percent at a high temperature, 120 degrees centigrade, for example. The IC packages which perform unsatisfactorily in the burn-in test are discarded as being unsatisfactory and only the IC package which continue to perform normally are shipped out as satisfactory products.

A new IC package of the surface loading type, a BGA (Ball Grid Array) package having ball-shaped lead terminals (solder balls) in the shape of a matrix or a zigzag on the bottom of the package, is becoming popular. The BGA package has such features as a wide terminal pitch despite the small outside dimensions and strong lead terminals, thereby making them resistant against deformations by contacts.

FIGS. 33 through 36 show the construction of a burn-in socket according to the prior art for loading a BGA package. FIG. 33 is a plan figure, FIG. 34 is a side view, FIG. 35 is a cross section, and FIG. 36 is an enlarged view of dashed line portion H of FIG. 35.

This socket comprises a base 100 as a main socket body to be fixed on a printed substrate (which is not shown in the drawings) and a cover 102 installed in such a way as to be opened or closed by a hinge on base 100. On one side of base 100, a hinge 106 is provided with a twisted coil spring 104 mounted on a shaft 110 journaled in base 100, the spring having respective ends received in recesses formed in the cover and base. Shaft 110 is also received in a bore formed in plate 108 of hinge 106 formed integrally with the lower surface of one side of cover 102, thereby making it possible for the cover 102 to rotate about rotary shaft 110 of hinge 106.

A rotary shaft 112 is provided on the opposite side of cover 102 with a latch 114 mounted on the shaft for holding cover 102 closed on base 100. A hook 114a of latch 114 is engageable with a protuberance or step part 100a provided on the opposing side of base 100 in order to close cover 114 relative to the upper surface of base 100. A lever 116 extends integrally with latch 114 in the opposite direction and, as this lever 116 is rotated in opposition to a compression coil spring 118, latch 114 is displaced from protuberance 100a of base 100, with a result that the cover 102 is opened.

A cavity 100b is formed on the upper surface of base 100 as shown in FIG. 35 and an adaptor plate 120 is disposed inside of cavity 100b. On the bottom of the cavity 100b, a large number of contacts 124 are mounted in a pattern which corresponds to the lead terminal pattern of the BGA package 122 which is to be loaded in the socket. The lower end 124c of each contact 124 that protrudes downwardly from the base is inserted into a mating aperture of the printed substrate (which is not shown in the drawings) as a socket terminal pin.

An aperture 120a extending through adaptor plate 120 of such a size as will accommodate the lead terminal (solder ball) 122a of BGA package 122 is provided at the portion of the adaptor plate 120 that corresponds to each contact 124, and the top portion 124a of each contact 124 is inserted into each aperture 120a in such a manner as to be able to move in a vertical direction. The intermediate part 124b of each contact 124 which extends between the bottom wall defining cavity 100b and the adaptor plate 120 forms a bent spring part which is generally in the shape of either a C or an S. Part 124b is so arranged as to elastically deform under the force (push-down force) applied on the upper end portion 124a from above.

Upon loading and positioning of BGA package 122 on base 100, each lead terminal 122a is placed on the top portion 124a of a respective contact 124 at a respective aperture 120a of adaptor plate 120. When the cover is closed to cover BGA package 122 from above, the curved spring part 124b of each contact 124 is elastically deformed by the compressive force from cover 102 and each lead terminal 122a and the top portion (contact part) 124a of the contact together move perpendicularly downwardly, with a consequence that an electric connection is obtained by compressive engagement between each terminal 122a and a respective contact portion 124a.

However, a socket made according to the prior art as described above has a number of associated problems. First, each lead terminal (solder ball) 122a makes a compressive engagement with each contact 124 on its lower or bottom surface portion with a result that the lower surface portion tends to become damaged or deformed. It is the bottom portion of the ball 122a that most seriously affects the soldering at the time a BGA package 122 is loaded onto a printed substrate and it is undesirable to damage or deform this important part during the burn-in test.

In this socket, further, the BGA package 122 is held between cover 102 and contact 124 and receives a force perpendicular to the package surface from both components, an upward and a downward force. The total force that the package receives is f*n which is a value obtained by multiplying the force f between one lead terminal 122a and a respective contact 124 by the total number of the lead terminals n. Assume, for example, the number n of the lead terminals is 500 and that the force for each f is 30 grams. Then, the force that the BGA package 122 receives will be as large as 15 kilograms.

Generally, the IC package is fixed in a structure with the IC chip containing wires bonded on a substrate with the wires on both surfaces covered with a molded resin and with the lead terminals (solder ball) being exposed on the bottom side of the substrate. When a large force such as the one described above is applied to the BGA package having such a construction, there is a possibility for the wires to be cut or the chip to be damaged inside the package.

In the conventional socket described above, the contact portion (upper edge) 124a of the contact 124 is displaced downwardly together with the lead terminal 122a inside aperture 120a of the adaptor plate 120 causing the C-shaped or S-shaped intermediate part (curved spring part) 124b of the contact 124 to be deformed in the direction of decreasing the radius of curvature, thereby generating an elastic force in the vertical direction. In view of the fact that the intermediate part of the contact 124 is curved in the shape of either C or S, the effective length (the conductor distance from contact part 124a to the distal tip of the terminal pin 124c) of contact 124 is substantially long, which is not desirable from an electrical characteristic standpoint.

In addition, since the displacement of contact 124 reaches a maximum value when cover 102 has been completely closed, and this is maintained throughout the duration of the burn-in test, a large stress is placed on contact 124 for a long period of time so that contact 124 tends to become fatigued and loses durability. Moreover, protrusion 124d of contact 124 is compressively inserted into the aperture of base 100, in effect biting into it. In such a construction in which contact 124 is pressed into the base 100 for mounting, the installation of contact 124 becomes complicated and it becomes difficult to replace a defective contact 124 after installation, thereby making it necessary to replace the entire socket in some cases.

As noted above, in a conventional socket, cover 102 is mounted for rotation by means of a hinge 106 and the cover is placed on the BGA package 122 that has been positioned in base 100 to thereby provide a force between the lead terminals 122a of the BGA package 122 and respective contacts 124.

In such a construction, the force changes as the thickness of the package 122 becomes different. When the thickness of the BGA package 122 is small, there is a possibility that the force is insufficient and the connection therefore becomes unsatisfactory. When the thickness of the BGA package 122 is large, on the other hand, the force becomes excessively large and contact 124 may be deformed, with a result that a consistent level of force cannot be obtained with packages having different thicknesses.

Since cover 102 covers BGA package 122, heat dissipation from the BGA package will not be satisfactory and there is a danger of the BGA package 122 being excessively heated. In addition to this, there are other shortcomings in that the rotary type cover 102 tends to take up excessive space when open and the construction of the device for automatically carrying out the loading and unloading operation of the IC package, the opening and closing operation of the cover, and the locking and releasing operation of the latch becomes extremely complicated.

SUMMARY OF THE INVENTION

It is an object of the present invention to provide socket apparatus which overcomes the problems of the conventional technology described above. Another object of the present invention is the provision of a socket which is suitable for electrical connection with the lead terminals of an electric part such as a BGA package.

Yet another object of the invention is the provision of a socket having a contact element which has such electric property characteristics and durability as are suitable for connection with the lead terminals of a BMG type package.

Still another object of the invention is the provision of a socket capable of obtaining a consistent, selected level of force between each lead terminal and each respective contact element without being affected by the thickness of the main body of the electric part.

Another object of the invention is the provision of a socket which can conserve space and which can easily be used for automation of loading and unloading of the electric Still another object of the invention is the provision of a socket which makes it easy to install or remove the contact elements in the main socket body.

Briefly, in accordance with the invention, a socket made in accordance with the invention comprises a main socket body for removably loading an electric part having lead terminals arranged in accordance with a prescribed pattern, a plurality of contact elements mounted in the socket body in a pattern corresponding to the pattern of the lead terminals of the electric part at prescribed locations of the socket body, the contact elements having a pair of elongated arm-shaped contact parts capable of elastically opening and closing for compressive engagement with each respective lead terminal of the electric part in such a way as to hold it and a contact opening and closing mechanism for opening and closing the pair of arm-shaped contacts of each of the contact elements.

According to a feature of the invention, the socket comprises a cover adapted to move vertically up and down relative to the main socket body, a slide plate slidable in an opening and closing direction of the pair of arm-shaped contact parts in a plane which is approximately perpendicular to the longitudinal axis of the contact elements on the said main socket body, an aperture for accommodating a pair of the arm-shaped contact parts of the contact elements provided in the slide plate at a location corresponding to each of the contact elements and an engagement part of the slide plate for engagement with one of the arm-shaped contact parts formed thereon, a spring member which elastically biases the slide plate in the direction in which the pair of arm-shaped contact parts of each of the contact elements is closed and a lever member which moves the slide plate in the direction in which the pair of the arm-shaped contact parts of the contact element are opened in opposition to the spring member.

According to yet another feature of the invention, each contact element is provided with an engagement portion which interacts with an engagement portion formed in an aperture formed in a stop member which receives a respective contact element. When the stop member is moved in a selected direction the engagement part in each aperture of the stop member is engaged with the engagement part of each contact element to securely hold the contact element. When the stop member is moved in the opposite direction, the engagement parts separate thereby making it possible for each contact element to be replaced.

According to a feature of the invention, when the opening and closing mechanism of the contact parts move in a prescribed direction when an electric part is being loaded, the pair of arm-shaped contact parts of each contact element are relatively displaced in mutually closing directions, thereby compressively engaging a lead terminal in such a way as to hold the terminal from generally opposite sides. When the opening and closing mechanism of the contact part moves in the opposite direction, the pair of arm-shaped contact parts of each contact element are displaced relatively in mutually opening directions, thereby being separated from each lead terminal.

According to another feature of the invention, the opening and closing mechanism of the contact parts in the socket comprises the cover, the slide plate, a spring member, and a lever member. When the downward force on the cover is removed when the electric part is being loaded, the pair of arm-shaped contact parts of each contact element are relatively displaced in the mutually closing direction, thereby engaging each lead terminal. At this time, the slide plate slides in one direction by the elastic return force of the spring member, with a result that the cover rises through a lever member. When the cover is pushed down, the lever member slides the slide plate in the opposite direction in opposition to the spring member, with a result that the arm-shaped contact parts of each contact element are relatively displaced in the mutually opening direction, thereby separating each lead terminal.

According to another feature of the invention, an opening in the cover is provided to facilitate loading and unloading an electric part through the opening and, in addition, to effectively dissipate heat generated from the electric part.

According to another feature of the invention, a latch member moves between a first position engaging the electric part and a second position free of the electric part in dependence upon the vertical movement of the cover through the latch operating means.

BRIEF DESCRIPTION OF THE DRAWINGS

FIGS. 5A-1 and 5B-1 are views similar to FIGS. 5(A) and 5(B) of a mirror image version of the contact element and FIG. 5(C) is a side view of the contact element;

DETAILED DESCRIPTION OF PREFERRED EMBODIMENTS

Figure 1:
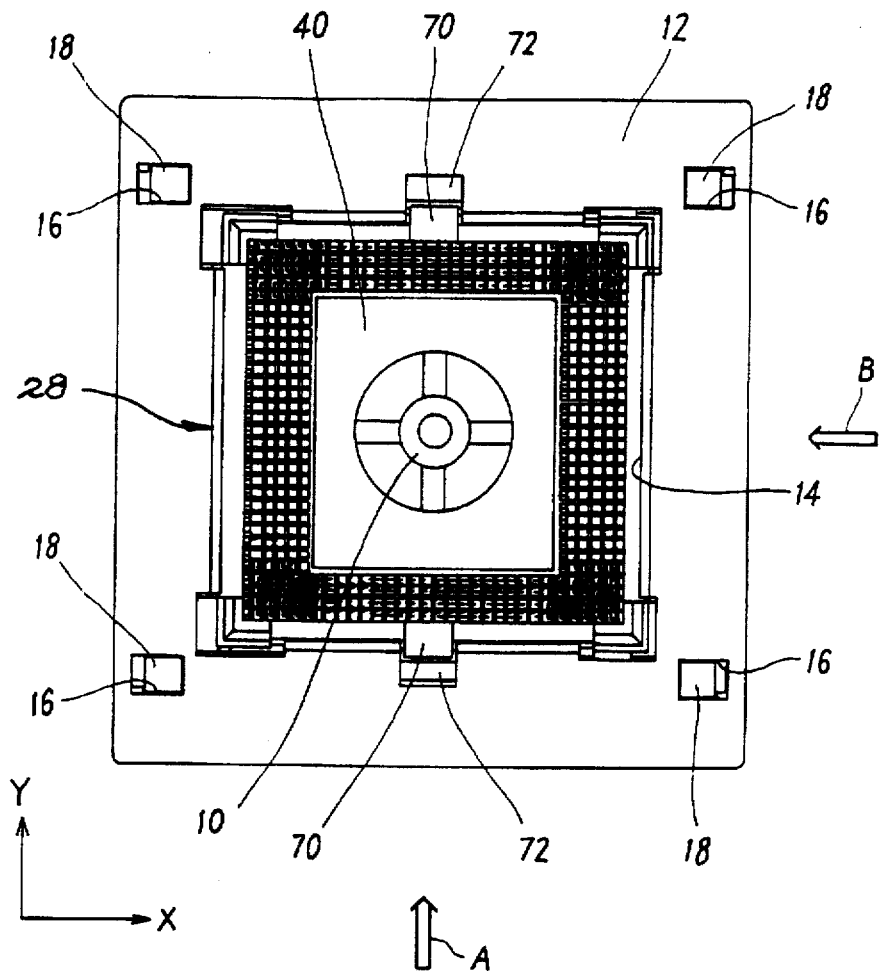
FIG. 1 is a top plan view of a socket made in accordance with the invention.
Figure 2:
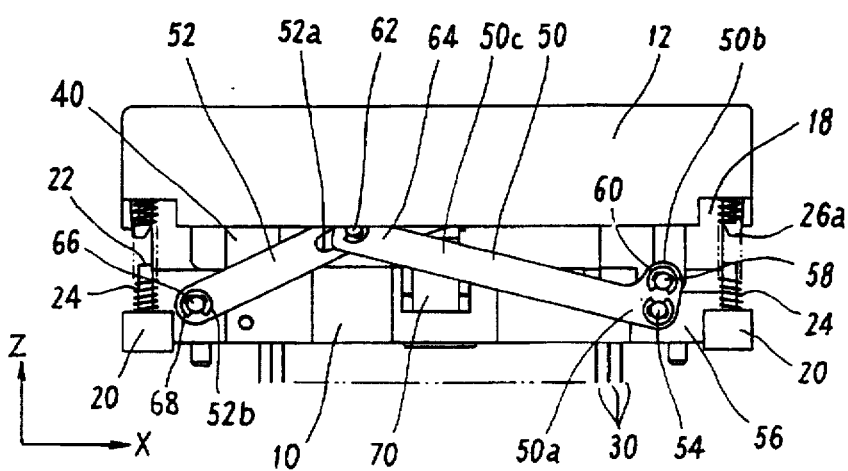
FIG. 2 is a side view of the FIG. 1 socket as viewed in the direction indicated by arrow mark A in FIG. 1.
Figure 3:
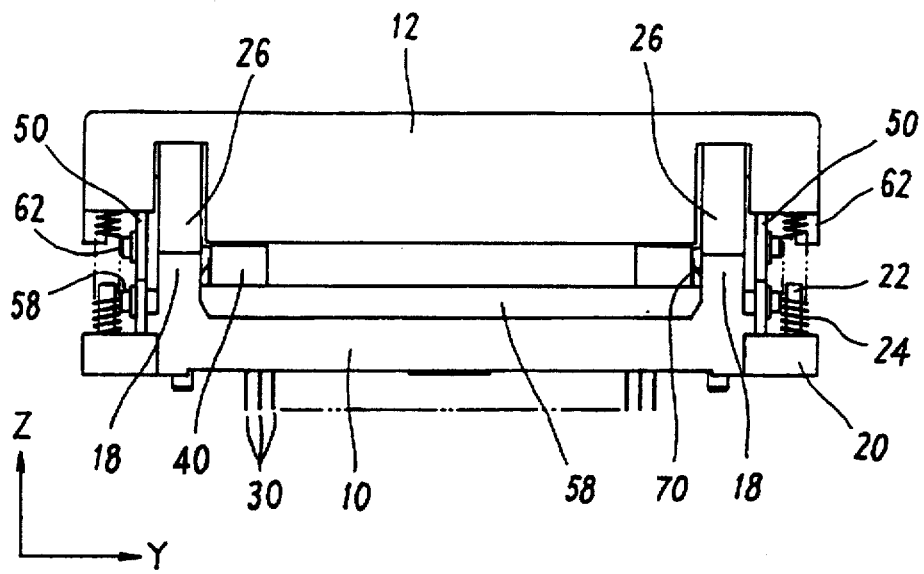
FIG. 3 is a side view of the FIG. 1 socket as viewed in the direction indicated by arrow mark B in FIG. 1.

In FIGS. 1 through 3, a socket is shown having a square base 10 as a main socket body to be fixed on a printed substrate (not shown in the drawings) and a square cover 12 fitting over the base and adapted to move vertically up and down relative thereto. Both base 10 and cover 12 may be formed by resin molding of suitable electrically insulative material. On cover 12, a large, centrally located, square opening is formed for inserting a BGA package into the main socket and removing it therefrom.

A guide hole 16 is formed in the vicinity of each of the four corners of cover 12 and guide bars 18, provided at the four corners of base 10, are slidingly inserted respectively into each guide hole 16 of cover 12. A spring support pintle 22 is provided on each flange piece 20 protruding outwardly from each of the four corners of base 10 and a compression coil spring 24 is perpendicularly placed between base 10 and cover 12 on each spring support pintle 22. Because of guide means 16 and 18 and compression coil spring 24, cover 12 is capable of alternate motion in the vertical direction relative to the base 10.

On the outside surface of cover 12 close to each guide bar 18 of base 10, a stop member 26 having an inner protrusion 26a at the distal end is formed, see FIG. 3(A). On the outer surface of each guide bar 18 that opposes each stop member 26, an outwardly extending protrusion 18a is provided at a location intermediate its ends. When no compressive force (external force) is applied to cover 12 from above, cover 12 is raised upwardly by the spring force of the compression coil spring 24. As the inner protrusion 26a of each stop member is engaged with the outer protrusion 18a of each guide bar 18 (see FIG. 23), the cover 12 is held at the height shown in FIGS. 2 and 3.

A large number of contacts (contact elements) 30 are mounted on base 10, arranged in a matrix form, inside an area 28 in the shape of a square frame. The number and the pitch arrangement of the frame-shaped contact area 28 and the contact elements 30 correspond to the pattern of the lead terminals (solder ball) 32a in a BGA package 31 which is to be loaded in this socket.

Figure 4A:
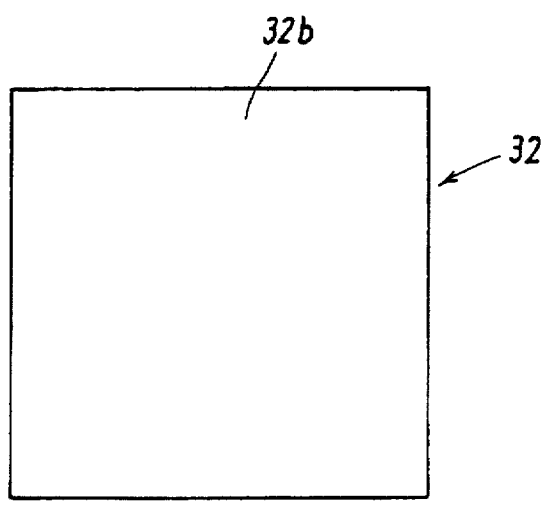
FIGS. 4(A), 4(B), and 4(C) are top, side, and bottom views respectively of a BGA package that is to be loaded on the FIGS. 1–3 socket.
Figure 4B:
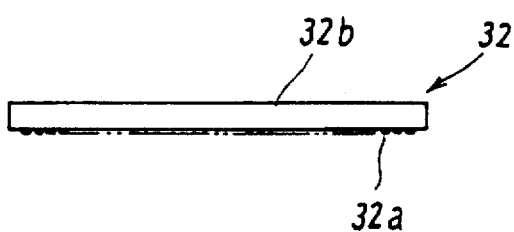
Figure 4C:
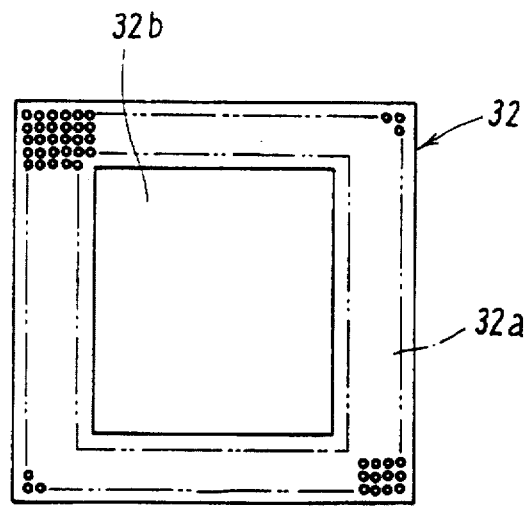

FIGS. 4(A), 4(B), and 4(C) show the external appearance of a typical BGA package. An LSI chip (not shown) is accommodated within the plastic package 32b of BGA package 32 and, on the bottom side of the package 32b, a large number of lead terminals (solder balls) 32a are mounted in a matrix in a square-framed area as shown in the drawing.

Figures 1, 2, 5A, 5B:
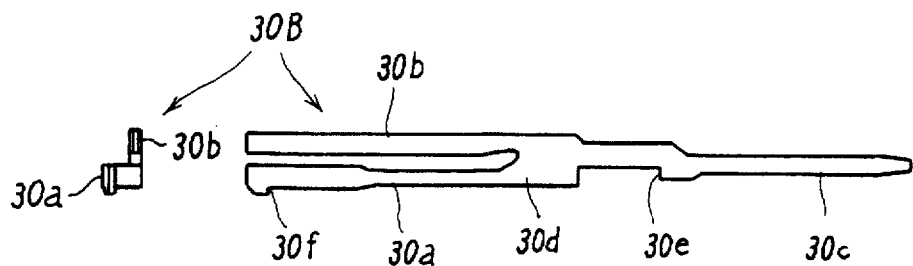
FIGS. 5(A) and 5(B) are top and front elevational views respectively of contact elements used in the FIGS. 1–3 structure.
Figures 5A, 5B:
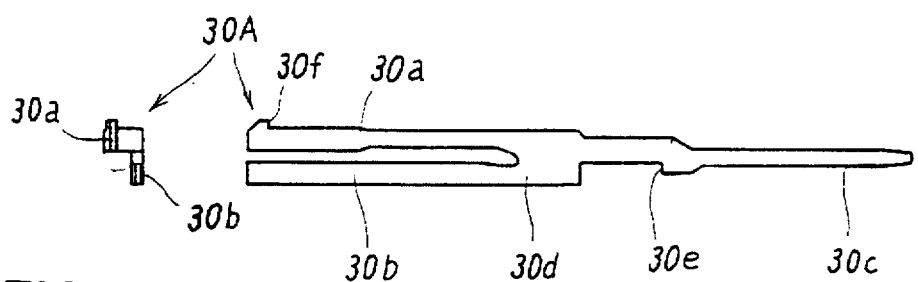
Figure 5C:
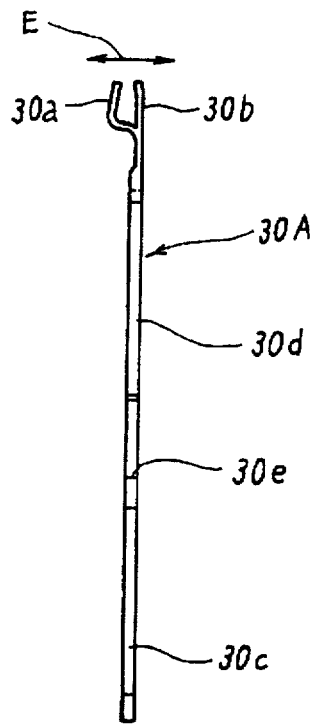

In FIGS. 5(A), 5(B) and 5(C), a first contact element 30A is formed as by stamping of an electroconductive thin sheet made of beryllium copper, for example, extending along the longitudinal axial direction as a pin 30c below the center and extending along the longitudinal axial direction by branching into two arms 30a and 30b above the center. The intermediate or center part 30d is held in a contact holding hole 34 of base 10 as will be described below.

An engagement portion or protuberance part 30e is formed somewhat lower than center part 30d and is made to engage with an engagement portion, protuberance 36b of a stop member 36 as will be described below. Pin 30c in the lower end is adapted for insertion into the printed substrate as a socket terminal pin.

As best seen in FIG. 5(C), one arm 30a is bent outwardly at the distal free end approximately at a right angle and is then bent upwardly also approximately at a right angle, thereby forming an approximate shape of an L. The other arm 30b is also bent inwardly at a small angle at the tip end. On the external side of the tip end of arm 30a (the surface of the reverse side as viewed from the other arm 30b as seen in FIG. 5(B)), a tab or protrusion 30f is further provided.

Figure 16:
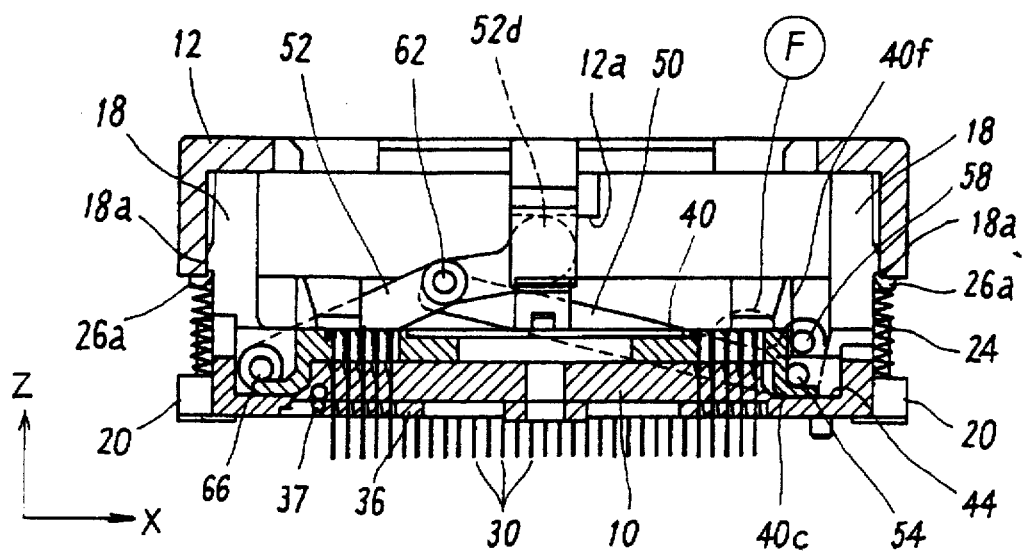
FIG. 16 is a cross sectional view taken on line 16—16 in FIG. 14.

The pair of arms 30a and 30b can be opened or closed elastically in mutually opposing directions (the directions indicated by E in FIG. 5(C)) and serve as a contact part for compressively engaging the lead terminal (solder ball) 32a of BGA package 32 in such a way as to hold it from opposite sides. Arms 30a and 30b are accommodated in the contact receiving aperture (through hole 42) of a slide plate 40 (FIG. 16) as will be described below, with tab 30f of arm 30A being engaged in a groove 30b inside the said contact accommodating aperture 42.

As shown in FIGS. 5(A') and 5(B'), a second contact element 30B has a mirror image construction relative to the construction of the first contact element 30A, with both arms 30a and 30b being reversed or rotated by 180 degrees. As will be described later, the first contact elements 30A are arranged with respect to the Y direction in odd-number rows and the second contact elements 30B are arranged in even number rows.

Figure 6:
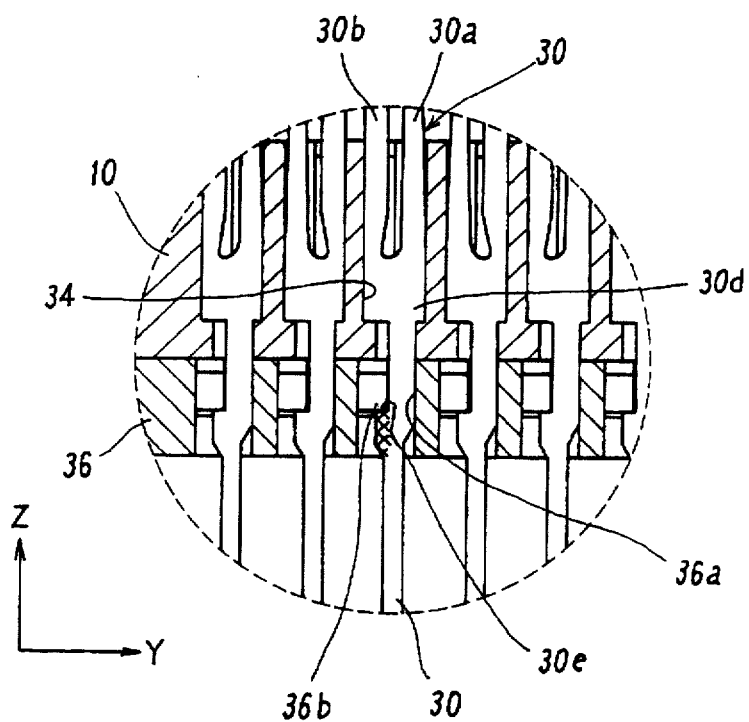
FIG. 6 is a cross sectional view of a portion of the mechanism for holding the contact element in the socket described in FIGS. 1–3.
Figure 7A:
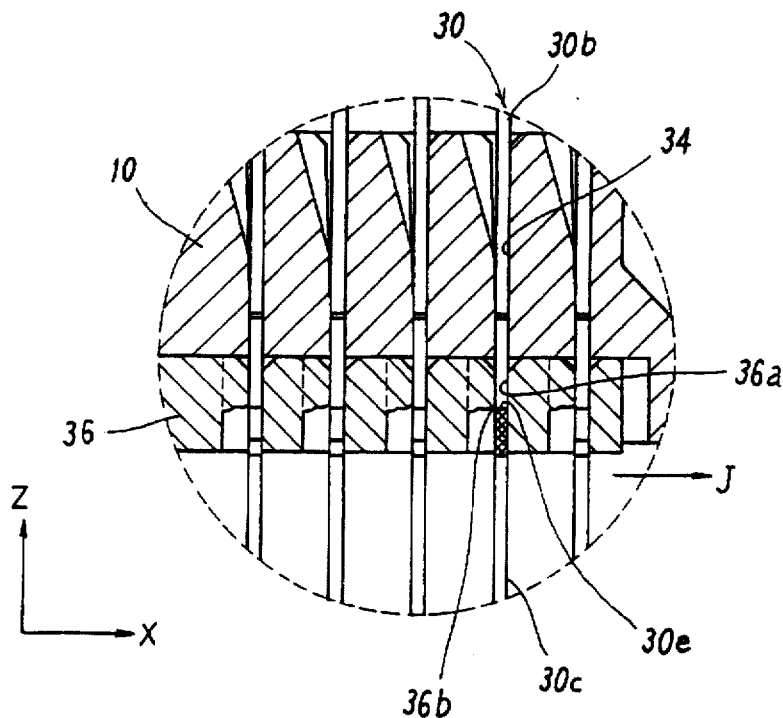
FIGS. 7(A), 7(B) are cross sectional views similar to FIG. 6 taken from another direction.
Figure 7B:
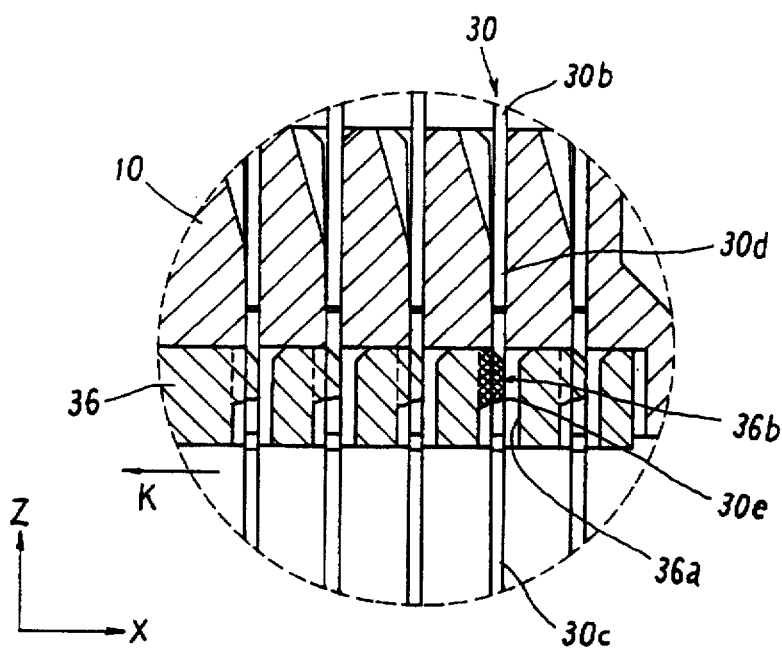

FIGS. 6 and 7(A), 7(B) are cross sectional views showing the mechanism for hold contact elements 30 (30A and 30B) in the socket, with FIG. 6 showing the direction corresponding to FIG. 5 (B, B') and FIGS. 7(A), 7(B) showing the direction corresponding to FIG. 5(C).

As shown in FIG. 6, each contact holding hole 34 of base 10 is formed in the shape of a battledore and the step portion of the center part 30d of the contact element 30 is engaged with the step part (where the size of the opening decreases) of the contact holding hole 34, thereby preventing the contact maker 30 from further downward motion.

In the socket, a plate-like stop member 36 is provided in engagement with the lower side of base 10. At the location corresponding to each contact element 30 of stop member 36 or each contact holding hole 34 of the base 10, there is provided an aperture 36a which accommodates the downwardly protruding part 30c from the base 10 of each contact element 30. The engagement protuberance portion 30e of contact element 30 is located approximately midway of aperture 36a. The aperture 36a has a considerable depth in the thickness direction of contact element 30, with an engagement protuberance portion 36b being formed on the upper half of one of its inner walls.

Because of this, if the stop member 36 is slid in the direction indicated by arrow mark J (FIG. 7(A)) from an unlocking position in which the contact element is detachably inserted into each through hole 36a of the stop member 36 to a locking position, engagement portion 36b in each aperture 36a is engaged on engagement portion 30e of each contact element 30 as shown in FIG. 7(B).

As the stop member 36 is fixed by means of a pin 37, for example, relative to the base 10 in the position shown in FIG. 7(B) (reference can be made to FIG. 16), any upward withdrawal of each contact element 30 is prevented. Even after the installation of contact element 30, the position shown in FIG. 7(A) can be restored by removing pin 37 and sliding the stop member in the direction indicated by an arrow mark K from the position shown in FIG. 7(B), with a consequence that a given contact element 30 can easily be replaced.

As described above, each contact element 30 has been detachably mounted in such a way as to prevent a downward withdrawal relative to base 10 in the socket of the embodiment and detachably fixed by the stop member 36 on the reverse side of the base 10 in such a way as to prevent an upward withdrawal, with a result that the operation for the installation or replacement of a contact 30 can be easily carried out.

Back in FIG. 1, a slide plate 40, constructed in such a manner as to be slidable in opening and closing directions of each pair of arms 30a and 30b of the respective elements is provided on the upper surface of the base 10. FIGS. 8 through 13 show the construction of slide plate 40, a generally square, resin-formed plate having generally planar top and bottom surfaces. At the location corresponding to each contact element 30 of the slide plate 40 or each contact holding hole 34 of the base 10, there is formed an aperture 42 extending from the top to the bottom surfaces for the reception of both arms 30a and 30b of each respective contact element. Accordingly, the pattern of the arrangement of the apertures 42 corresponds to the desired pattern of the contact elements 30.

Figure 8:
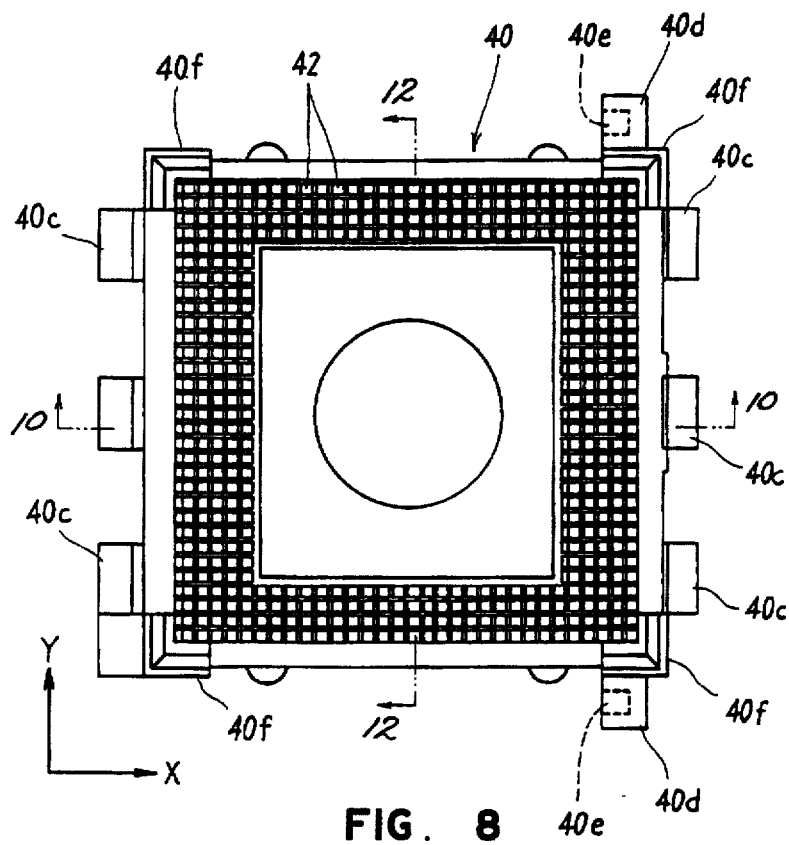
FIG. 8 is a top plan view showing the construction of a slide plate in the socket shown in FIGS. 1–3.
Figure 9:
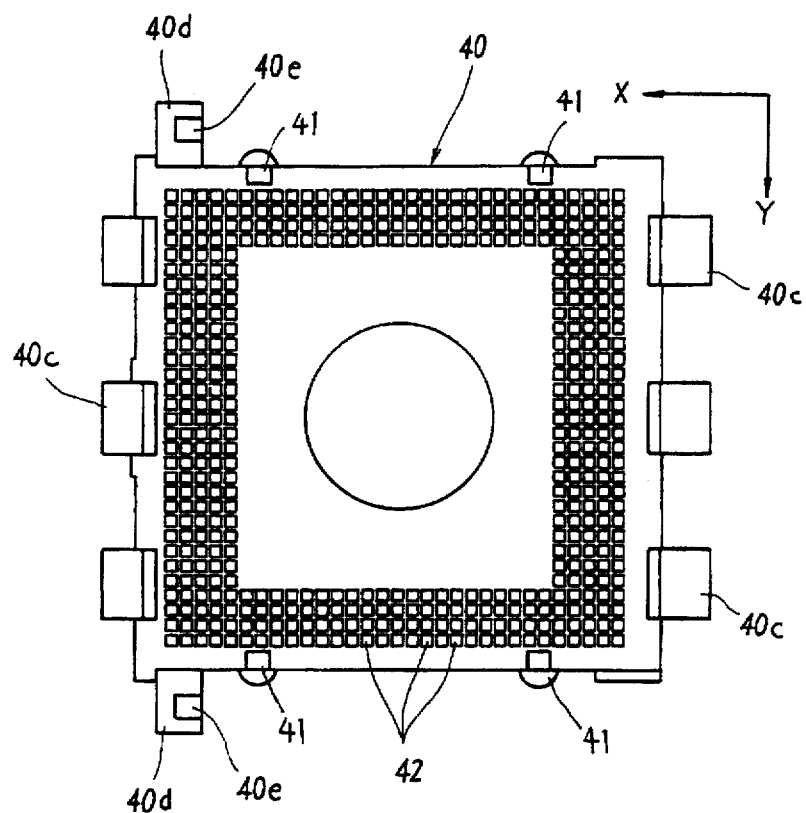
FIG. 9 is a bottom view showing the construction of the FIG. 8 slide plate.
Figure 10:
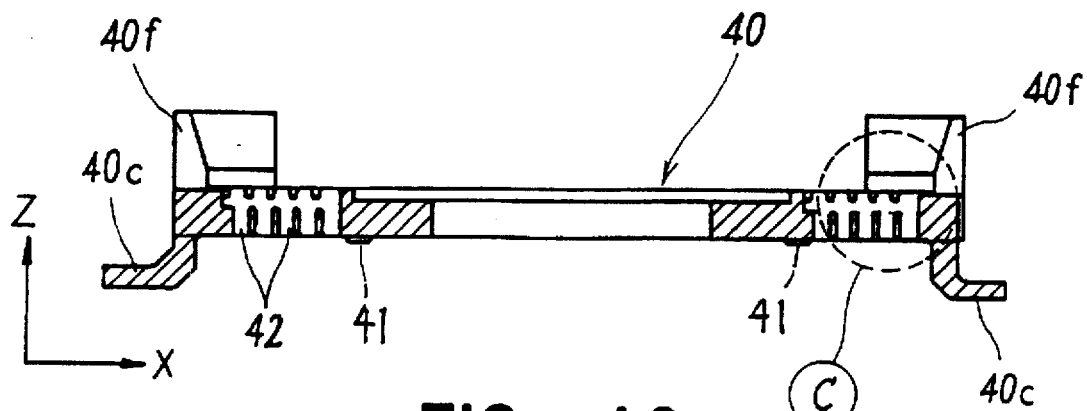
FIG. 10 is a cross sectional view taking along line 10—10 in FIG. 8.
Figure 11:
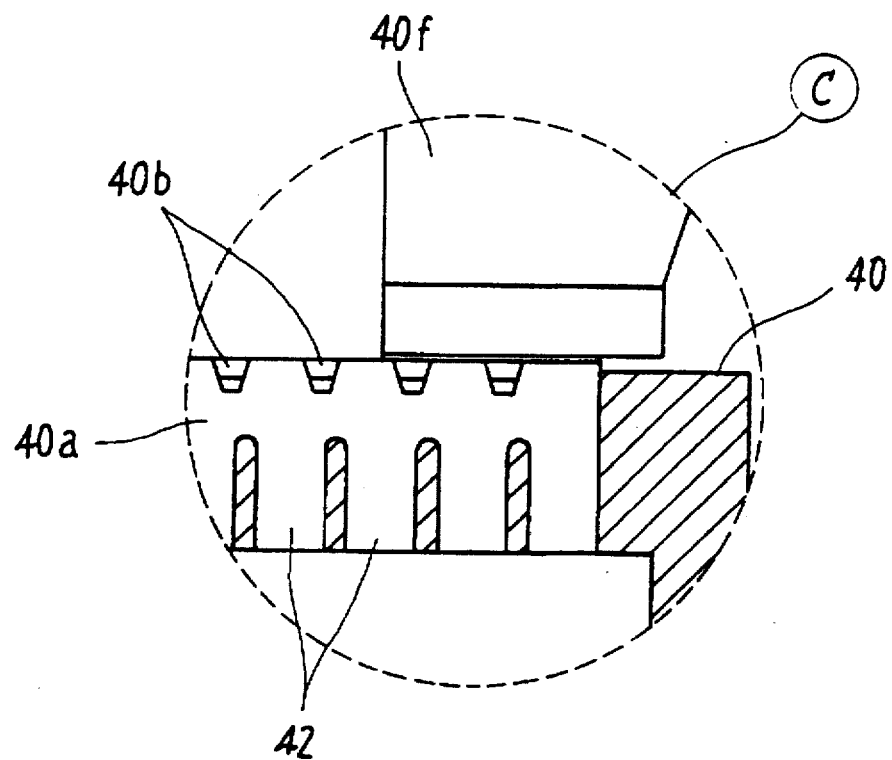
FIG. 11 is an enlarged view of a portion of FIG. 10 denoted by dashed lines C.
Figure 12:
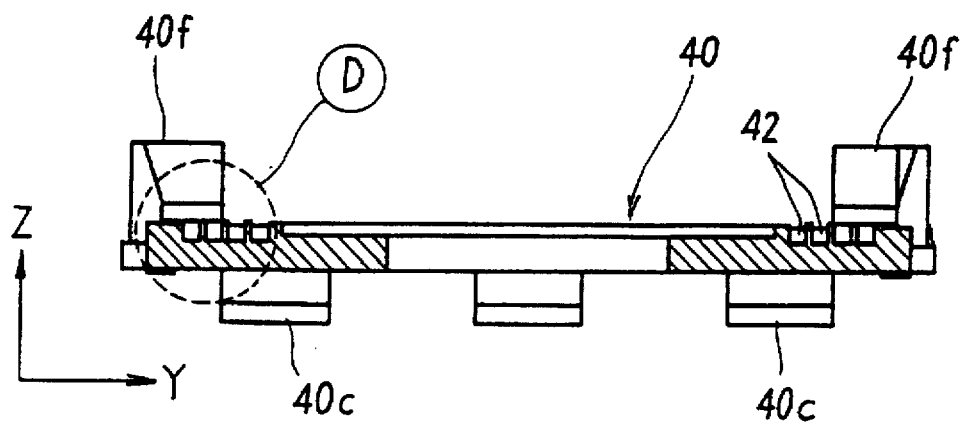
FIG. 12 is a cross sectional view taken along line 12—12 in FIG. 8.
Figure 13:
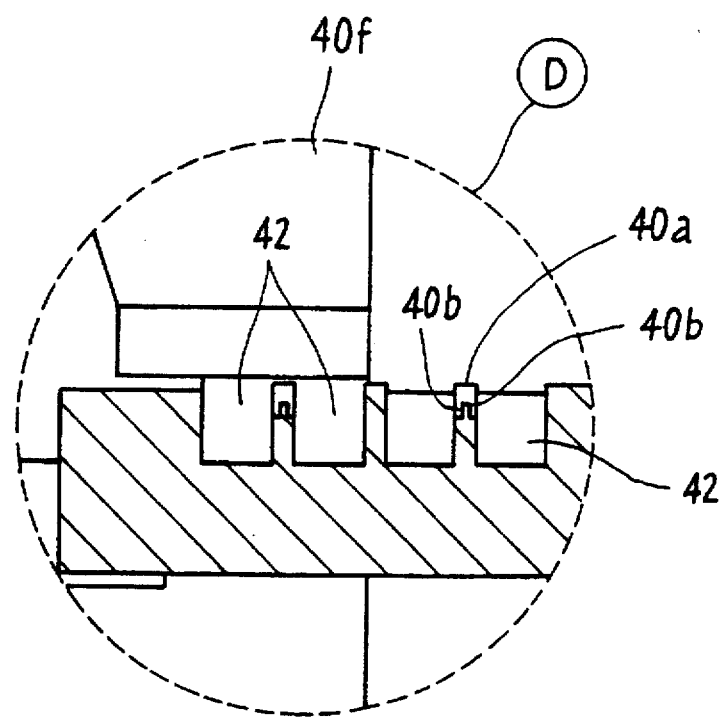
FIG. 13 is an enlarged view of a portion of FIG. 12 denoted by dashed line D.
Figure 14:
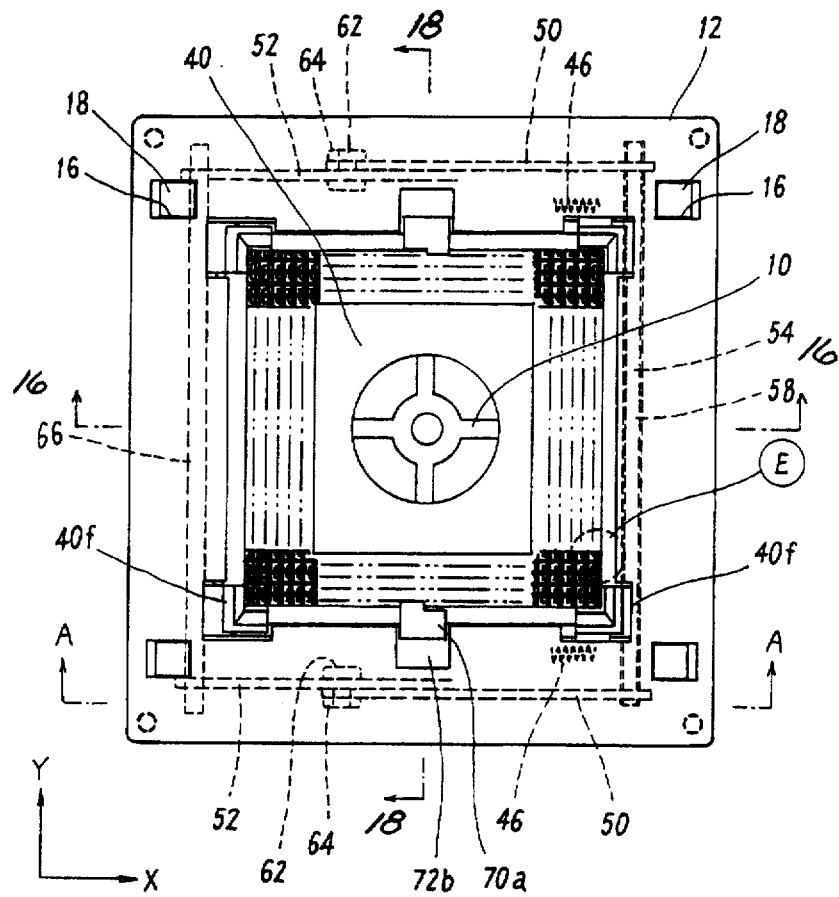
FIG. 14 is a plan figure showing the socket as a whole for the purpose of explaining the inner structure of the socket of the embodiment.

As shown in FIG. 9, the lower opening portion of each aperture 42 is formed approximately in the shape of a square separated by a wall from adjacent apertures 42. As shown in FIGS. 8, 10 and 11, the upper opening portion of each aperture 42 is in communication with the adjacent apertures 42 in one direction (X direction in FIG. 8) and is separated by a partition wall 40a in the other direction (Y direction in FIG. 8). On both sides of odd number partition walls 40a, there is formed a groove 40b for engagement with tab 30f of a respective arm 30a of the first and second contact elements 30A and 30B as will be described later. Grooves 40b are formed at a location which are somewhat offset in the X direction from the central axis of each aperture 42.

With reference to FIGS. 8–10, a plurality of L-shaped legs 40c, such as three L-shaped legs 40c, are formed on a pair of mutually opposing sides of the slide plate 40. At one side on either end and close to the leg part 40c (the right-side in FIG. 8), a spring receiving part 40d protrudes outwardly in a direction which is perpendicular to the leg 40c. On the lower side of each spring receiving part 40d there is formed a groove 40e for reception of one end of a compression coil spring 46 as will be described below. A guide post 40f having a tapered surface for guiding and positioning the peripheral part of a BGA package 32 is formed at each of the four corners of slide plate 40.

Figure 15:
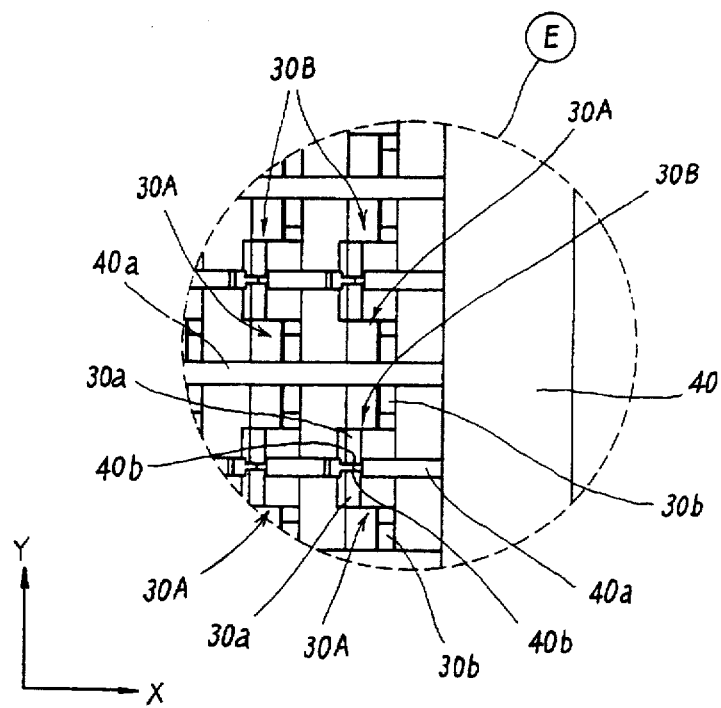
FIG. 15 is an enlarged view of a portion of FIG. 14 denoted by dashed lines E.
Figure 17:
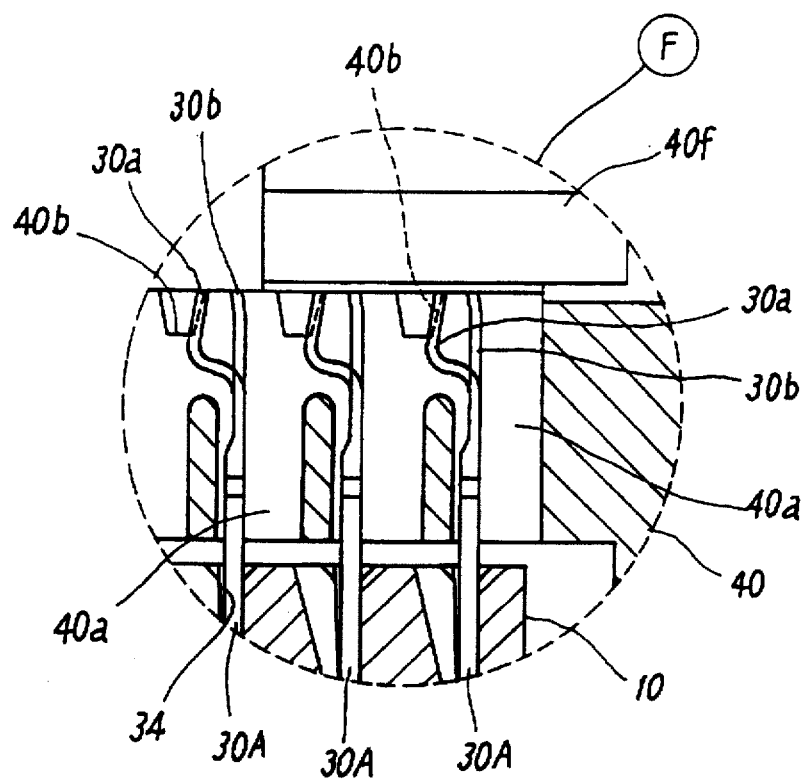
FIG. 17 is an enlarged view of a portion of FIG. 16 denoted by dashed lines F.
Figure 18:
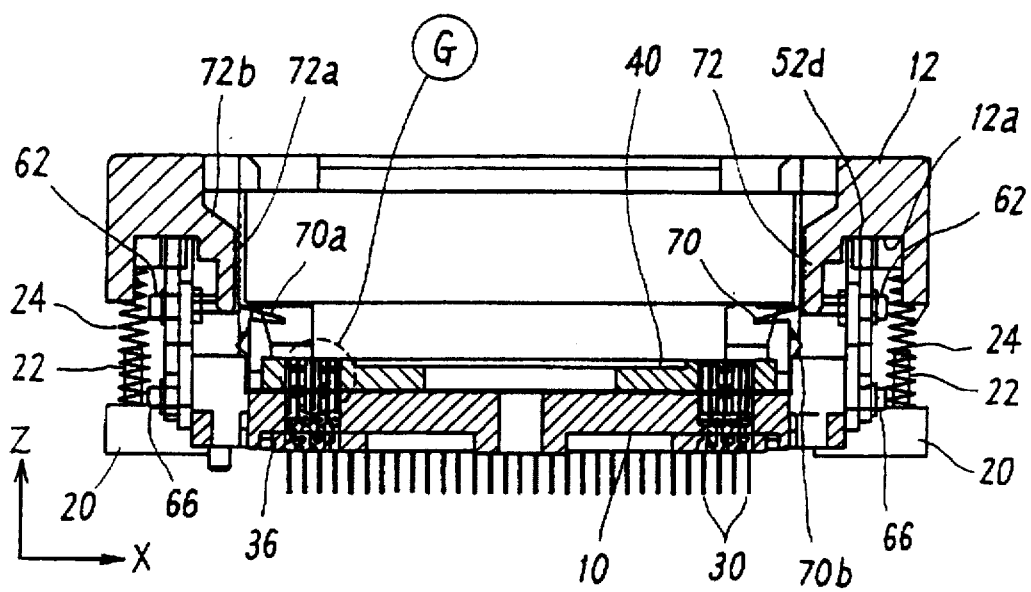
FIG. 18 is a cross sectional view taken on line 18—18 in FIG. 14.
Figure 19:
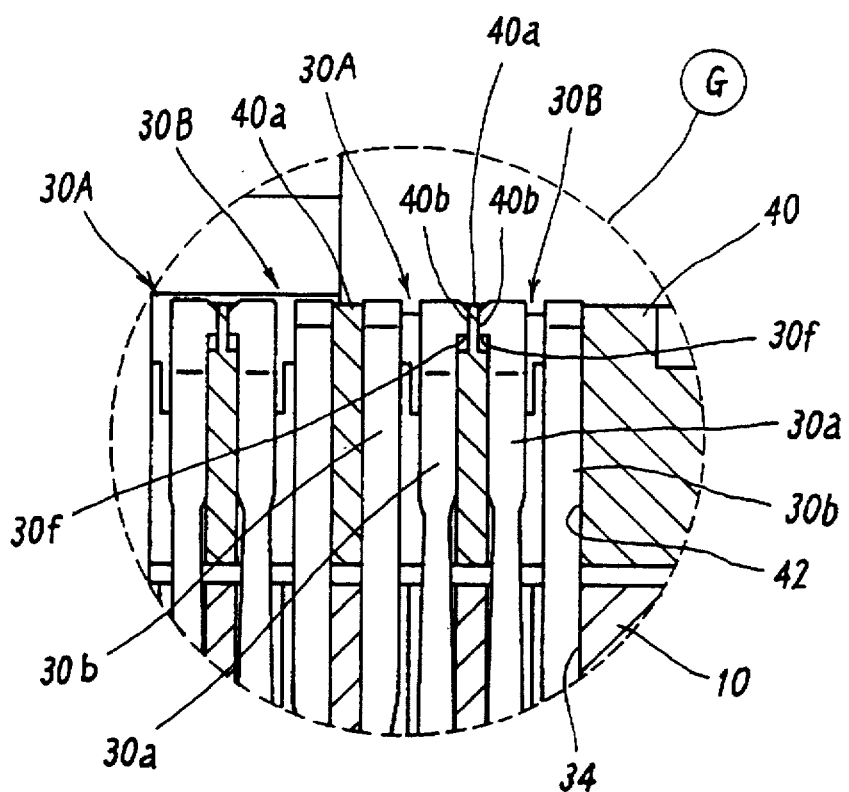
FIG. 19 is an enlarged view of a portion of FIG. 18 denoted by dashed lines G.

FIGS. 14 through 19 show the inner structure of the socket in detail. With reference to FIGS. 15, 17 and 19, each contact element 30 has its center part 30d held in a respective contact holding hole 34 of the base and a pair of arms 30a and 30b at its distal tip accommodated in a respective aperture 42 of the slide plate 40. In the X direction, the contact elements 30A or 30B are arranged in one row and, in the Y direction, the first contact element 30A and the second contact element 30B are arranged alternately. Accordingly, the first contact element 30A and the second contact element 30B are arranged on both sides of each partition wall 40a of the slide plate 40 and one side of the arms 30a are engaged by tab 30f from both sides in the groove 40b at the top of the partition wall 40a. A pair of arms 30a and 30b of each contact element 30 mutually face in the X direction. In other words, both arms 30a and 30b open or close in the X direction.

As shown (FIGS. 8–10), slide plate 40 has a plurality of protrusions 41 on the side edge. As shown in FIGS. 17 and 19, the slide plate is installed spaced slightly above the top of base 10. Since the legs 40c of the slide plate 40 slides under the rotary lever shafts 54 and 66 (FIG. 16) as will be described below, floating in the X direction can be prevented and the slide plate 40 stabilized. Because of this, slide plate 40 slides in the X direction without engaging the upper surface of the base 10 at locations other than the protrusion 41. In each contact element, one arm 30a is engaged with the partition wall 40a of the slide plate 40 by tab 30f at the tip, with a result that both arms 30a and 30b can be opened or closed by the sliding of the slide plate 40 in the X direction.

Next, a slide driving mechanism for slide plate 40 in the X direction in dependence upon the vertical movement of cover 12 in this embodiment will be explained. This slide mechanism comprises a spring member which biases the slide plate 40 in the X direction (which will hereafter be the positive X direction, X+) at all times and a lever member which moves in the opposite direction (which will hereafter be the negative X direction, X−) in opposition to the spring member.

Figure 20:
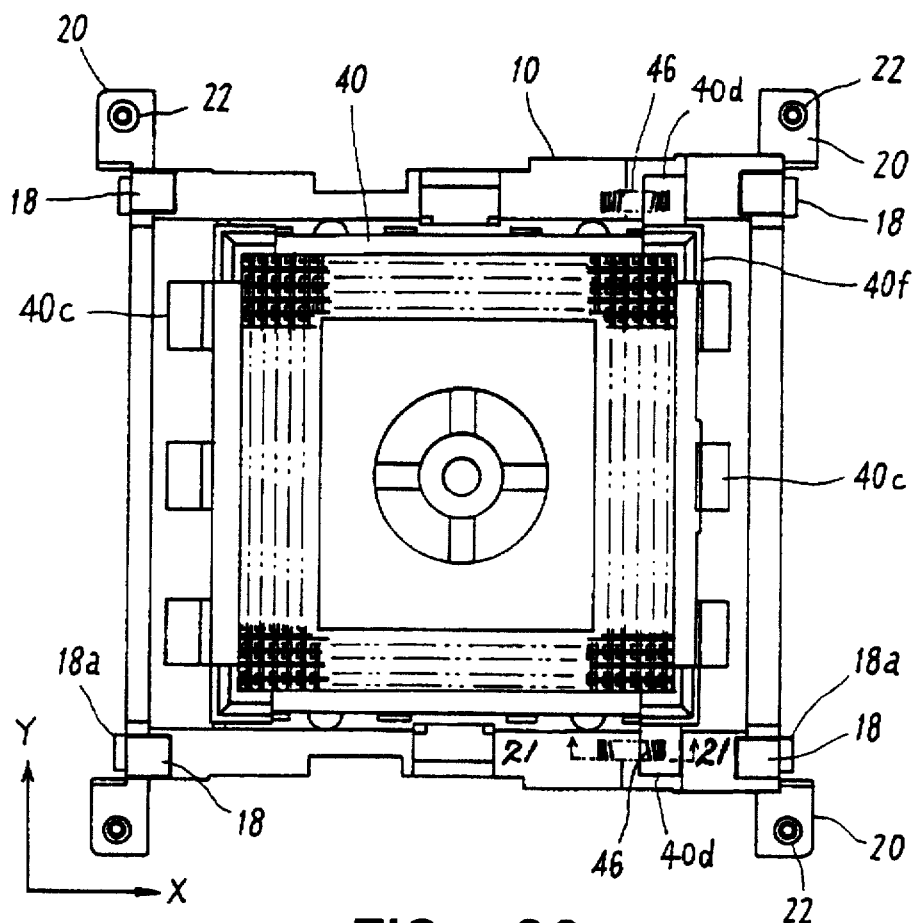
FIG. 20 is a plan view showing the assembly including the base and the slide plate in the socket of the embodiment.
Figure 21:
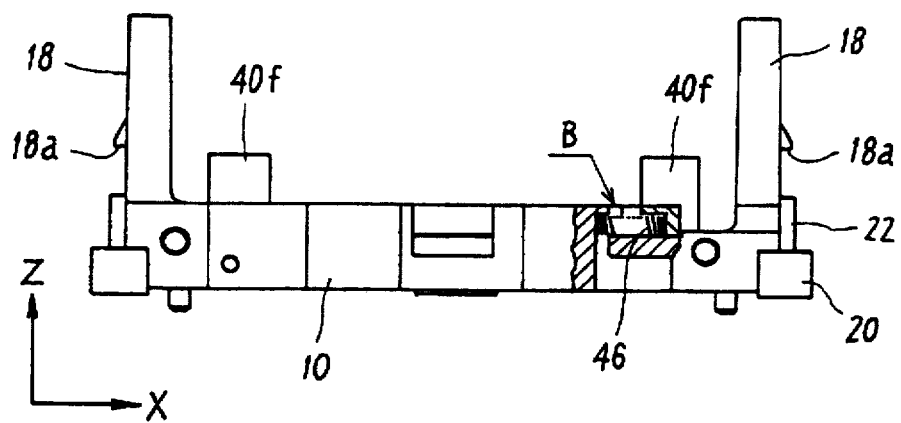
FIG. 21 is a front view having a portion in cross section taken along line 21—21 in FIG. 20.

FIGS. 20 through 22 show the location of the installation of a spring member which provides the bias in the positive X direction, X+, with FIG. 20 being a plan view of the assembly of base 10 and slide plate 40, FIG. 21 a partial cross section taken along line 21—21 in FIG. 20 and FIG. 22 an expanded view of part B of FIG. 21.

Figure 22A:
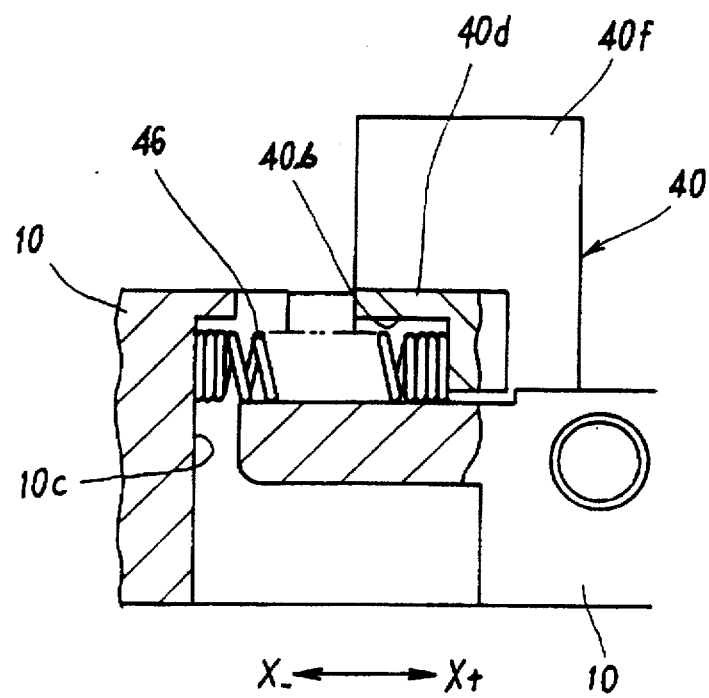
FIGS. 22(A), 22(B) respectively are enlarged views of the cross sectional portion of FIG. 21 shown in two different positions.
Figure 22B:
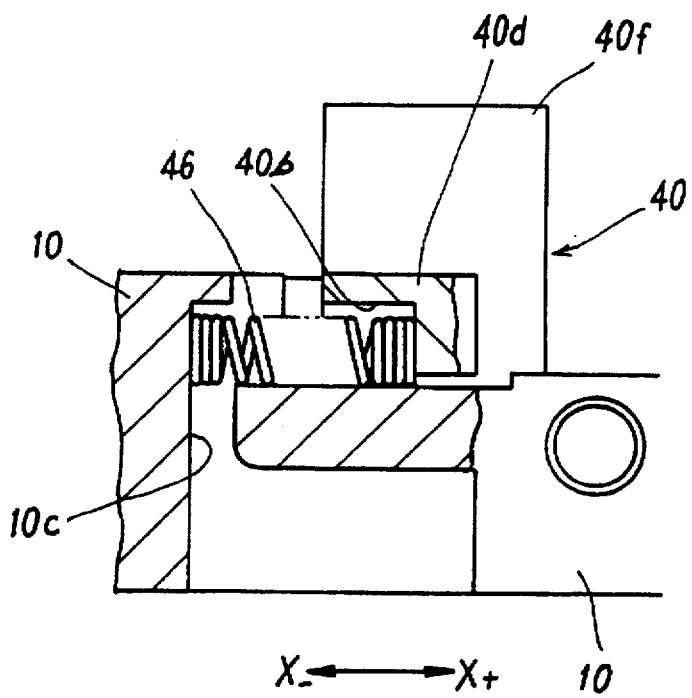

Compression coil spring 46 is provided in close proximity to a pair of spring receiving grooves 40b of slide plate 40. As shown in FIGS. 22(A), 22(B), one end of the compression coil spring 46 is fixed to the spring receiving part 40d of the slide plate 40 and the other end is fixed to the wall surface 10c of the base 10. As noted above, slide plate 40 is slidably movable in the X direction on base 10 and is biased in the positive X direction, X+, by the spring force of the compression coil spring 46.

As shown in FIGS. 2, 3, 14, 16, 18 and 23(A)–23(C), the lever mechanism of the socket comprises a pair of levers 50 and 52 constituting a link mechanism mounted on both sides of the base 10 with respect to the Y direction.

The first lever 50 is approximately in the shape of an L and has a bent part 50a, a short arm 50b and a long arm 50c. The bent part 50a of lever 50 is rotatably installed on each end of fixed shaft 54 mounted on base 10 extending in the Y direction through an E ring 56. The short arm 50b of lever 50 extends upwardly at an angle which is close to right angle from the bent part 50a toward the side of the slide plate 40 and is linked through E ring 60 to each end of movable shaft 58 which traverses the upper surface of base 10 in the Y direction, adjacent one side of slide plate The long arm 50c of lever 50 extends upwardly from bent part 50a at an acute angle toward the center of the socket, with its distal free end being linked through an E ring 64 to a pin 62 which has been slidably inserted into an elongated groove or opening 52a that has been formed in an intermediate portion toward the top of second lever 52.

The second lever 52 is formed approximately in a straight line, with its base 52b being rotatably installed through an E ring 68 at each end of fixed shaft 66 mounted at the other end of the base 10 and extending in the Y direction. The top part 52c of this lever 52 is rotatably linked to the distal end of the first lever 50 through pin 62 disposed in groove 52a and E ring 64 and, at the same time, extends vertically upwardly after bending somewhat toward the horizontal direction from the vicinity of the upper end of groove 52a, with its circular upper edge 52d being in engagement with the lower surface of the motion transfer portion 12a which protrudes downwardly on the inner surface of cover 12 at the center of the socket.

Figure 23A:
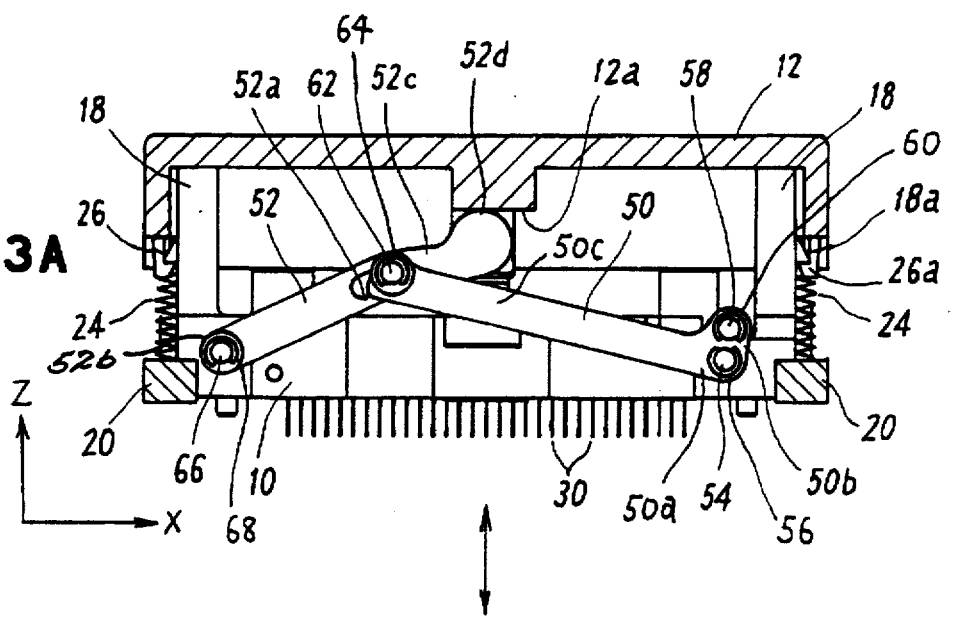
FIGS. 23(A), 23(B), and 23(C) are cross sectional views respectively showing the various stages of the lever movement linked to the vertical movement of the cover in a socket made in accordance with the invention.
Figure 23B:
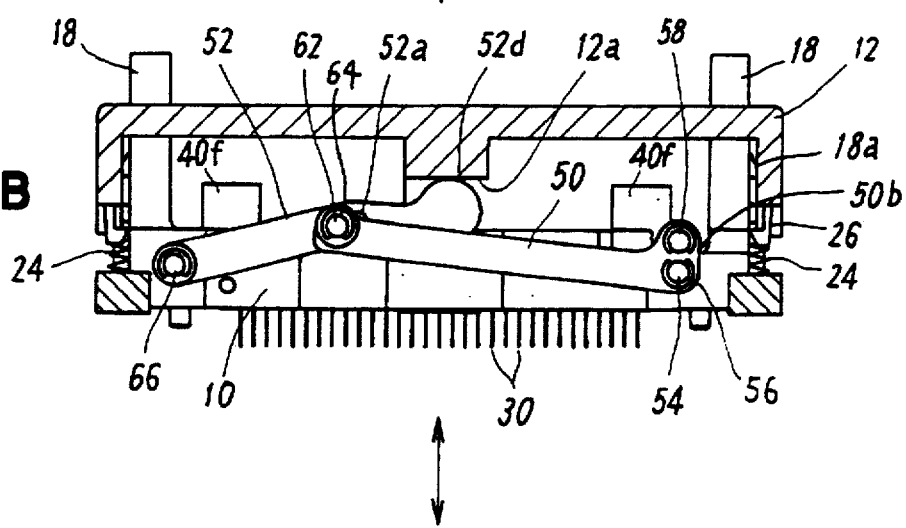
Figure 23C:
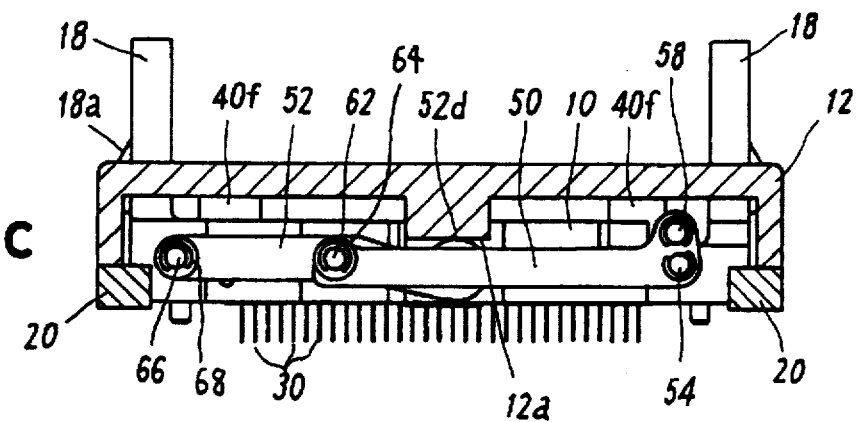

FIG. 23(A), 23(B), and 23(C) are cross sectional views showing the various stages of movement of levers 50 and 52 which are linked to the vertical movement of cover 12, FIG. 23(A) depicts the situation when cover 12 is at its highest position, FIG. 23(B) when cover 12 is at an intermediate height and FIG. 23(C) when cover 12 is at its lowest position. In FIG. 23(A), when cover 12 has been raised to its highest position by the spring force of compression coil spring 24, the respective distal ends of the first and second levers 50 and 52 are at their highest positions. As the slide plate 40 is moved in the positive X direction by the spring force of the compression coil spring as shown in FIG. 22(A), 22(B), the movable axis 58 is moved in the direction of X+ on one side (right side) of the slide plate 40, with a consequence that the first lever 50 as a whole moves upwardly (clockwise) and, as a result, the lever 52, too, moves in an upwardly direction (counter clockwise) through connective parts 62 and 52a.

When cover 12 is pressed down, the motion transfer portion 12a of cover 12 transfers force to the tip 52d of the second lever 52, thereby pressing lever 52 downwardly with a result that the lever 52 rotates in a downwardly direction (clockwise direction), followed by the rotation of the first lever 50 in the downwardly direction (counter clockwise) through the connective parts 62 and 52a, with a consequence that the movable shaft 58 which is connected to the short arm 50b of lever 50 moves in the negative X direction, while pressing one side (right side) of the slide plate 40, as is shown in FIG. 23(B). At this point, compression coil spring 46 is compressively deformed as shown in FIG. 22(B) and the slide plate 40 slides in the X– direction.

The counteraction created when cover 12 has been pressed downwardly is produced by the spring force of compression coil spring 24 that directly works on the four corners of cover 12 and the spring force of the compression coil spring 46 which indirectly works on the motion transfer portion 12a of cover 12 through the slide plate 40, the movable shaft 58 and the levers 50 and 52.

When the cover is pressed down to the lowest position, both levers 50 and 52 rotate to their lowest positions shown in FIG. 23(C), with a result that the movable shaft 58 and the slide plate 40 are displaced to the maximum in the X– (negative) direction. The compressive deformation of the compression coil springs 24 and 46 also reach a maximum at this position.

When the force on cover 12 is released, the various movable parts shift in a direction which is opposite to the above, i.e., from the FIG. 23(C) position to the FIG. 23(B) position and then to the FIG. 23(A) position.

The first lever 50 linked to the movable shaft 58 is formed in the shape of an L having a long lever arm linked to the second lever 52. As a result, a substantially light (small) downward force on cover 12 is sufficient to move the slide plate 40 in the X– (negative)direction in opposition to the spring force of the compression coil spring 46.

Figures 24A, 24B:
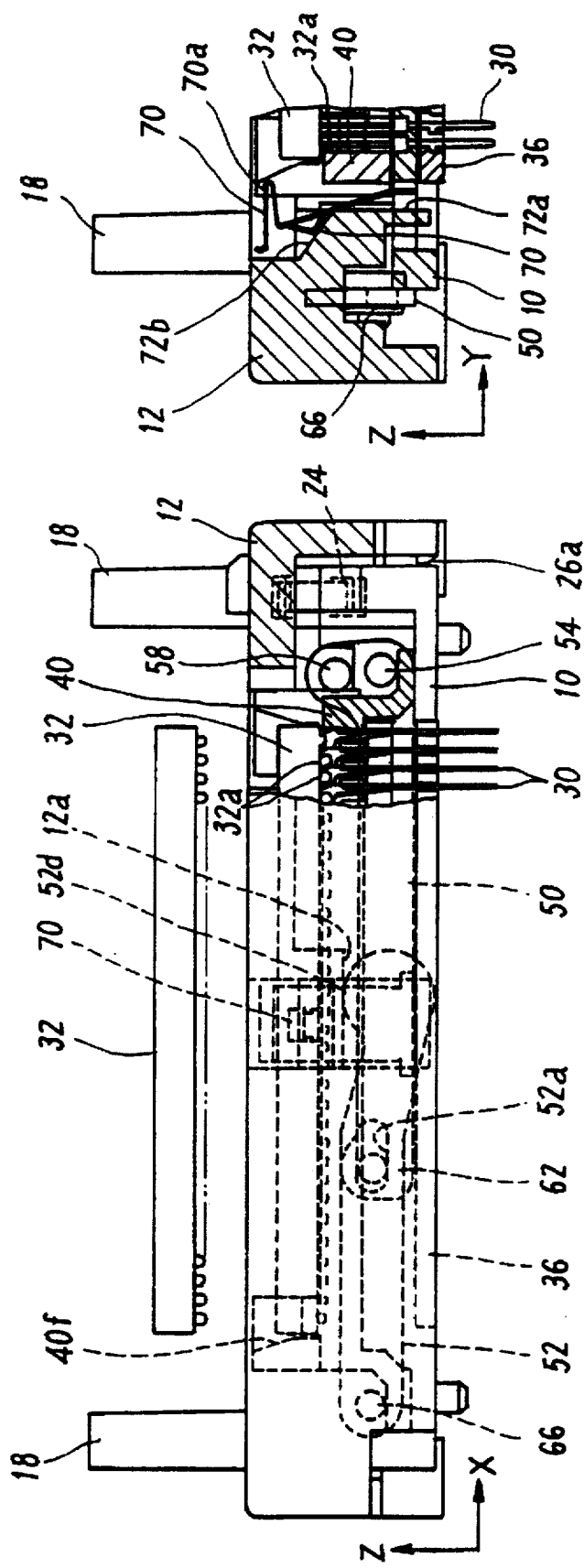
FIGS. 24(A), 24(B) are cross sectional views showing the structure inside the socket when the BGA package is loaded with the cover pressed down to its lowest position in the socket described in the embodiment.

In FIGS. 1 through 3, FIG. 14 and FIG. 18 once again, a pair of latches 70 in the shape of a spring plate are mounted on base 10 at a location which is close to both sides of the slide plate 40 in the Y direction, and at the center in the X direction of the socket. As best seen in FIG. 24(B), the lower end of each latch 70 is fixed to base 10, with either the intermediate portion or the upper end being elastically displaced in a plane which is perpendicular to the longitudinal axis of the lower end of the plate. An electric part holding portion 70a protruding transversely inwardly in the shape of V is formed at the top and a lower guide part 70b protruding outwardly in the shape of L is formed in the intermediate portion.

Behind each latch 70, there is provided a latch guide (latch operating part) 72 which extends perpendicularly downwardly from the inner wall of the cover 12. Latch guide 72 has the lower portion and the intermediate portion formed on a perpendicular guide surface 72a and the top portion formed on a guide surface 72b which is tapered outwardly in an upward direction.

When the top (upper guide portion) of the latch 70 is in touch with the perpendicular guide surface 72a of the latch guide 72 as shown in FIG. 18, the latch 70 is elastically displaced in such a manner as to bow toward the socket center and the electric part holding portion 70a covers the top of the outer peripheral part of the slide plate 40 at the electric part seat. When cover 12 is pressed down, the lower guide portion 70b of latch 70 moves to the inclined guide surface 72b, with a consequence that latch 70 returns to its original shape by its spring return force and the electric part holding portion 70a moves away from the top of the electric part seat at the outer peripheral part of the slide plate 40.

Next, the action connected with the loading of the BGA package on the socket will be explained by referring to FIGS. 24 through 32.

Figure 25:
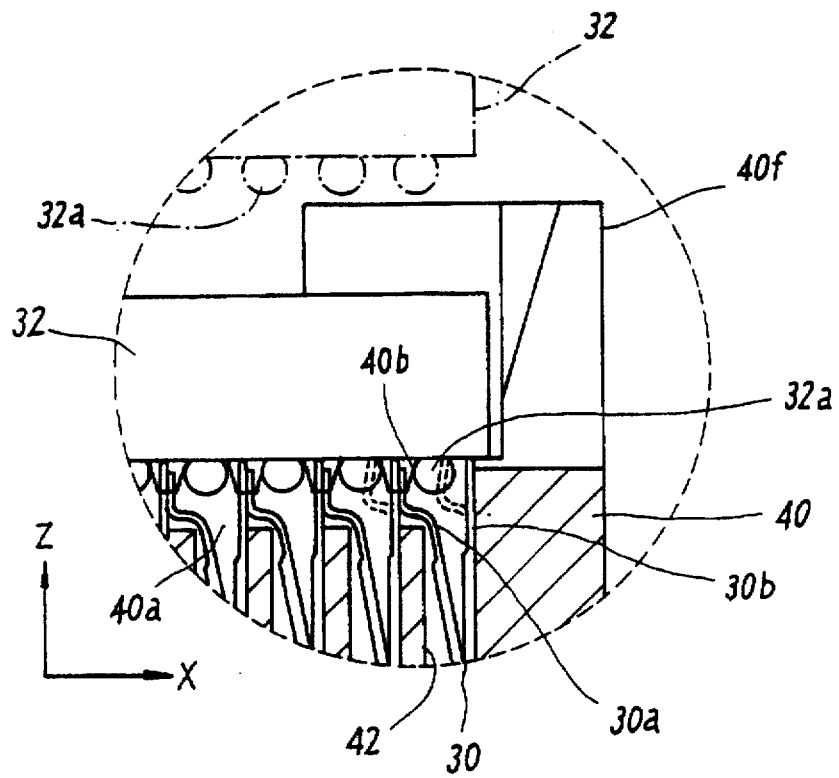
FIG. 25 is an enlarged view of a portion of FIG. 24(A)
Figure 26:
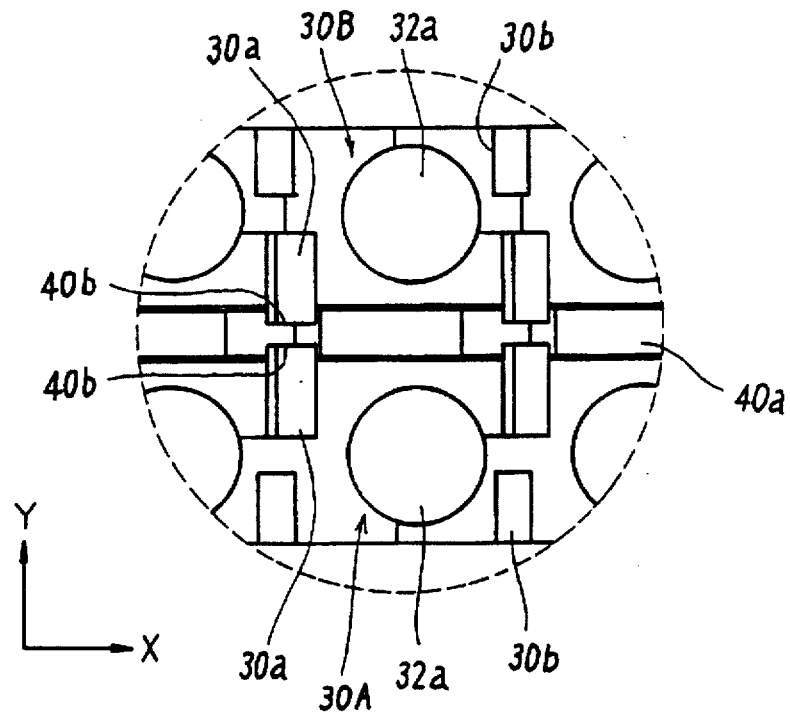
FIG. 26 is an enlarged top view showing the typical positional relationship between lead terminals (solder ball) and a pair of arms of respective contact elements in the socket which is in the state shown in FIG. 24.

FIGS. 24 through 26 show the state in which cover 12 has been pressed downwardly to the position of its lowest extreme, with FIGS. 24(A) and (B) being partial cross sections of the construction of the socket interior with the GBA package being loaded, FIG. 25 being an enlarged view of the essential part of FIG. 24(A), and FIG. 26 being an enlarged view showing the typical positional relationship between lead terminals (solder ball) 32a and arms 30a and 30b of respective contact elements.

When cover 12 is pressed downwardly as shown in FIG. 24(B), latch 70 assumes its original position with its lower guide part 70b being in engagement with the inclined guide surface 72a of latch guide 72 and the electric part holding portion 70a moving outwardly away from the electric part seat outside, with a consequence that it becomes possible to insert the BGA package 32 into the socket through opening 14 of cover 12 from above. In this case, the peripheral part of the BGA package 32 is guided by the inside surface of a guide post 40f of the slide plate 40 (FIG. 25) into its seat and each lead terminal (solder ball) 32a of the BGA package 32 enters the aperture 42 of the slide plate 40 that corresponds thereto.

When cover 12 is pushed down as described above, the slide plate 40 slides in the X– direction through levers 52 and 50 and movable shaft 58. One arm 30a of each contact element 30 which is engaged with the groove 40b on the partition wall 40a of the slide plate 40 shifts toward X– along with the sliding of slide plate 40 but the other arm 30b remains stationary, with a result that both arms 30a and 30b will open. As shown in FIGS. 25 and 26, therefore, each lead terminal (solder ball) 32 of the BGA package 32 is freely inserted between both arms 30a and 30b of a respective contact element 30.

Figure 27:
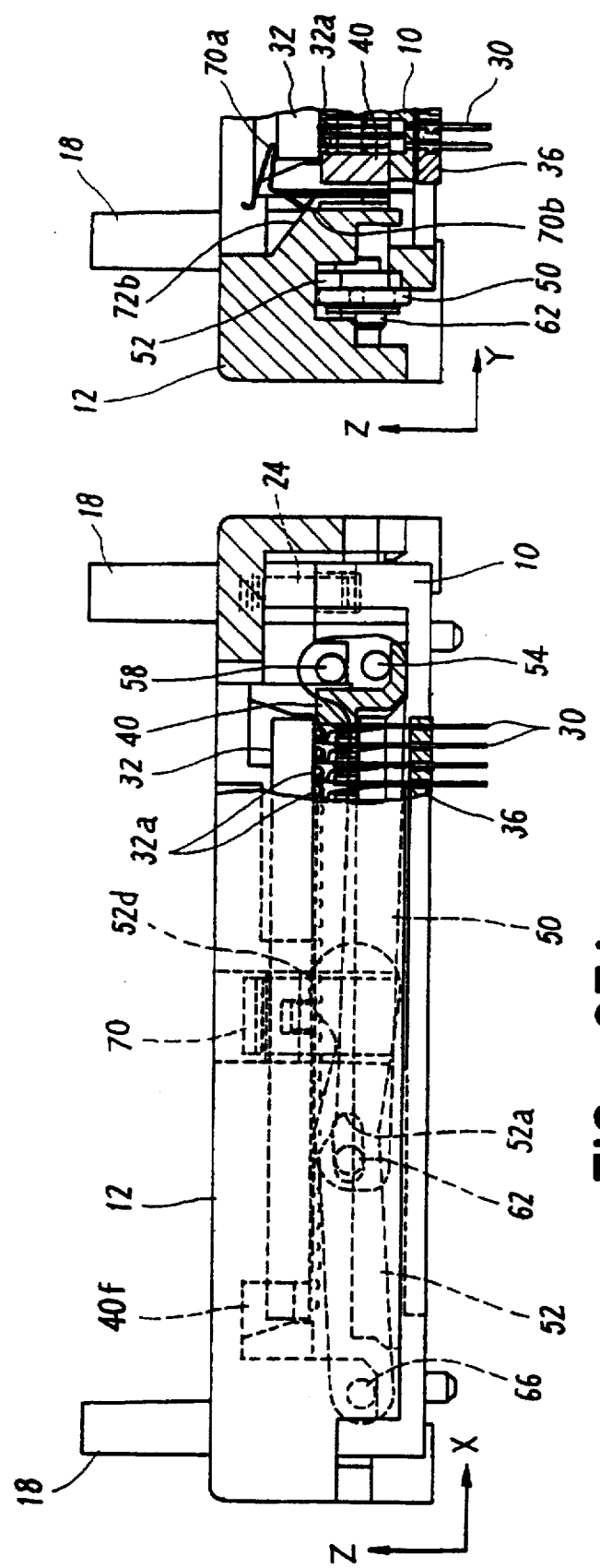
FIGS. 27(A), 27(B) are cross sectional views showing the structure inside the socket when the cover is at an intermediate height with the BGA package being loaded in the socket of the embodiment.
Figure 28:
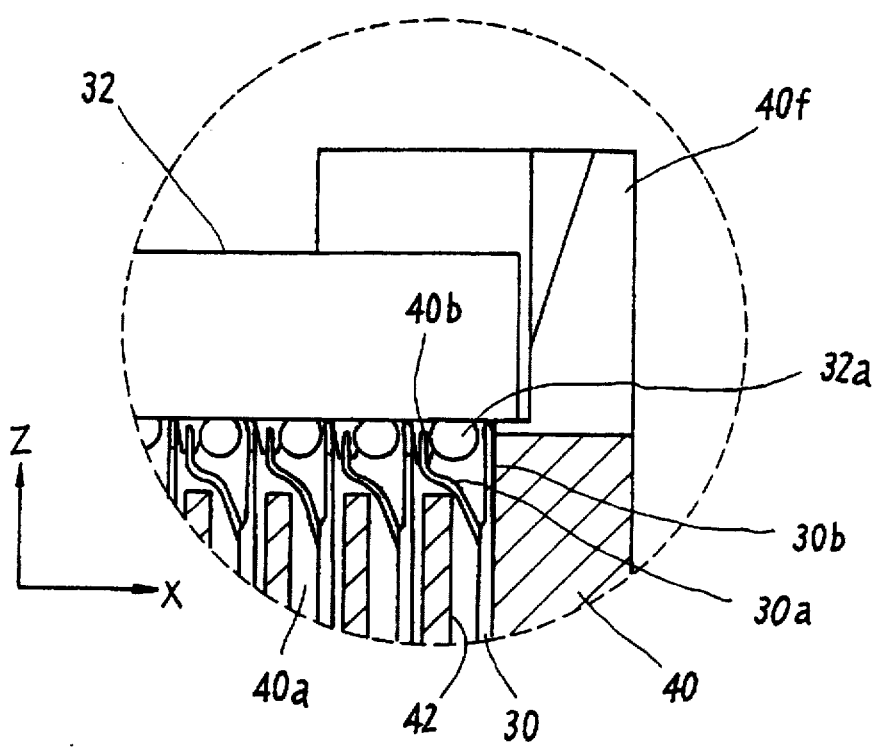
FIG. 28 is an enlarged view of a portion of FIG. 27(A)
Figure 29:
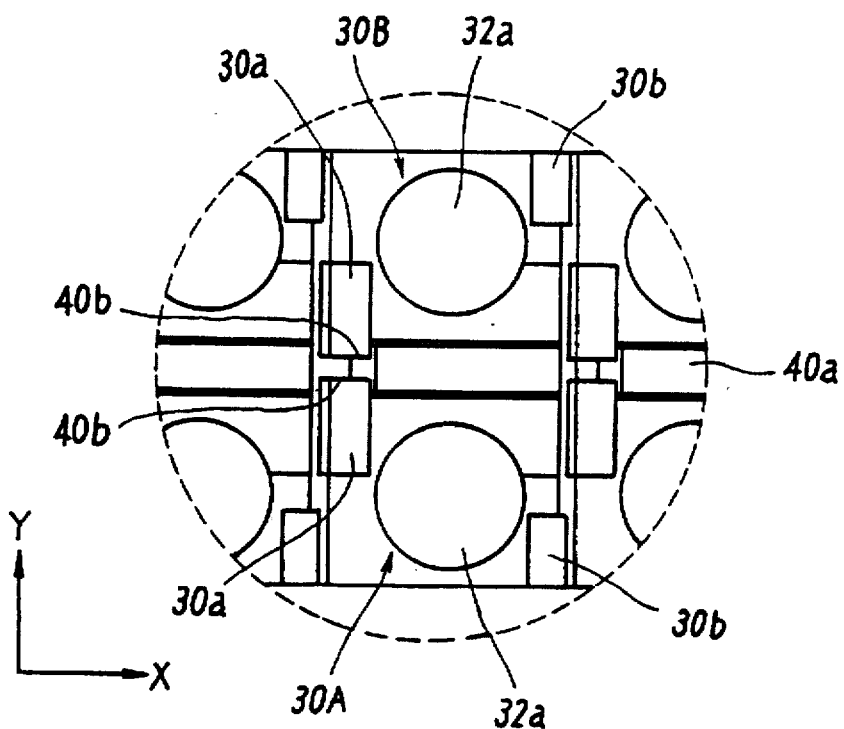
FIG. 29 is an enlarged top view showing the typical positional relationship between lead terminals (solder ball) and a pair of arms of respective contact elements in the socket in the state shown in FIG. 27.

FIGS. 27 through 29 show the state in which the downward force on cover 12 is removed and cover 12 is moving upwardly, with FIGS. 27(A) and (B) being partial cross sections showing the construction of the socket interior at that time, FIG. 28 being an enlarged view of the essential part of FIG. 27(A) and FIG. 29 being an enlarged view showing the typical positional relationship between lead terminals (solder ball) 32 and arms 30a and 30b of respective contact elements 30.

When the downward force on cover 12 is removed, the slide plate 40 slides in the X+ direction by the spring force of the compression coil spring 46. As arm 30a of each contact element 30, engaged with a respective groove 40b on the partition wall 40a of slide plate 40, also moves integrally with the slide plate 40, the distance between both arms 30a and 30b becomes smaller as shown in FIGS. 28 and 29. Along with the sliding of the slide plate 40 in the X+ direction, the first lever 50 rotates upwardly (clockwise direction) through movable shaft 58 and the second lever 52 also rotates upwardly (counter clockwise direction) through a lever connective part 62 as shown in FIG. 27(A).

Also, as seen in FIG. 27(B), along with upward movement of cover 12, the lower guide part 70b of latch 70 moves from the inclined guide surface 72b of latch guide part 72 to the vertical guide surface 72a and the electric part holding portion 70a of latch 70 moves forward and becomes engaged with the outer periphery of the upper surface of the BGA package 32.

Figures 30A, 30B:
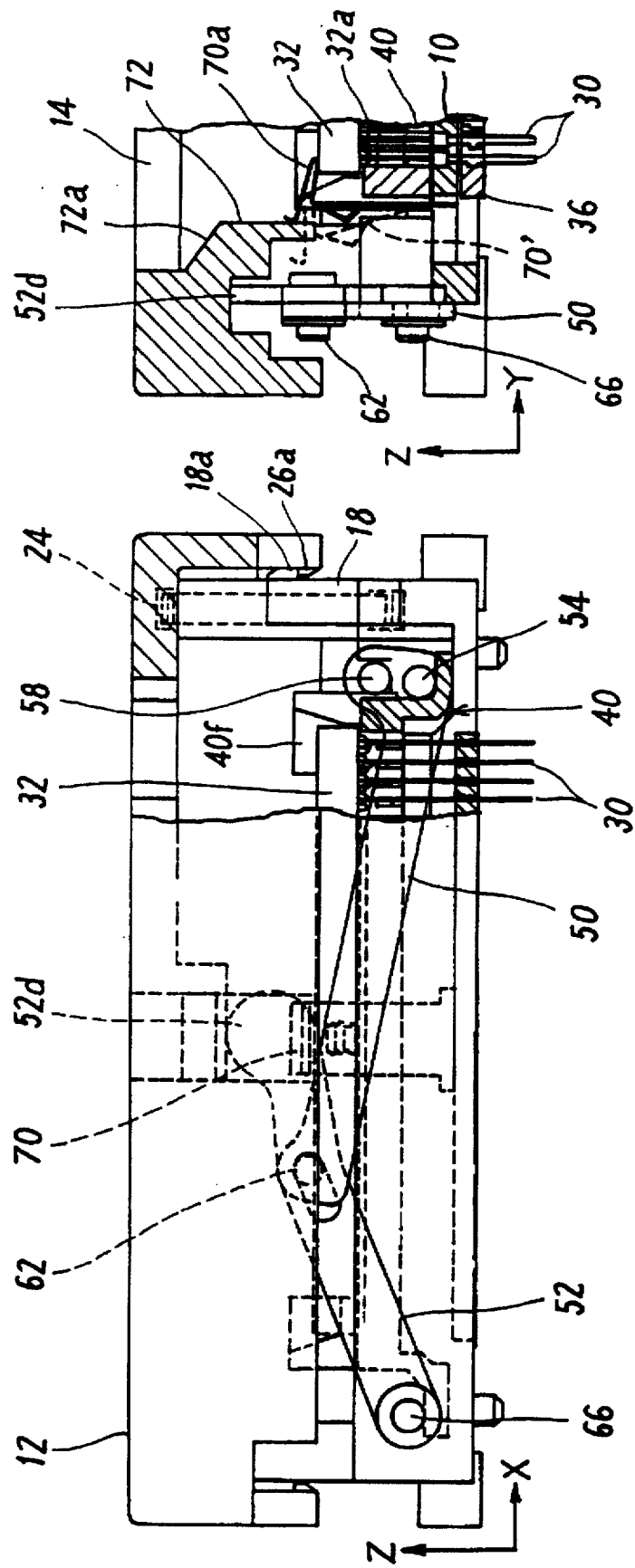
FIGS. 30(A), 30(B) are cross sectional views showing the structure inside the socket when the cover is at its highest position with the BGA package loaded in the socket.
Figure 31:
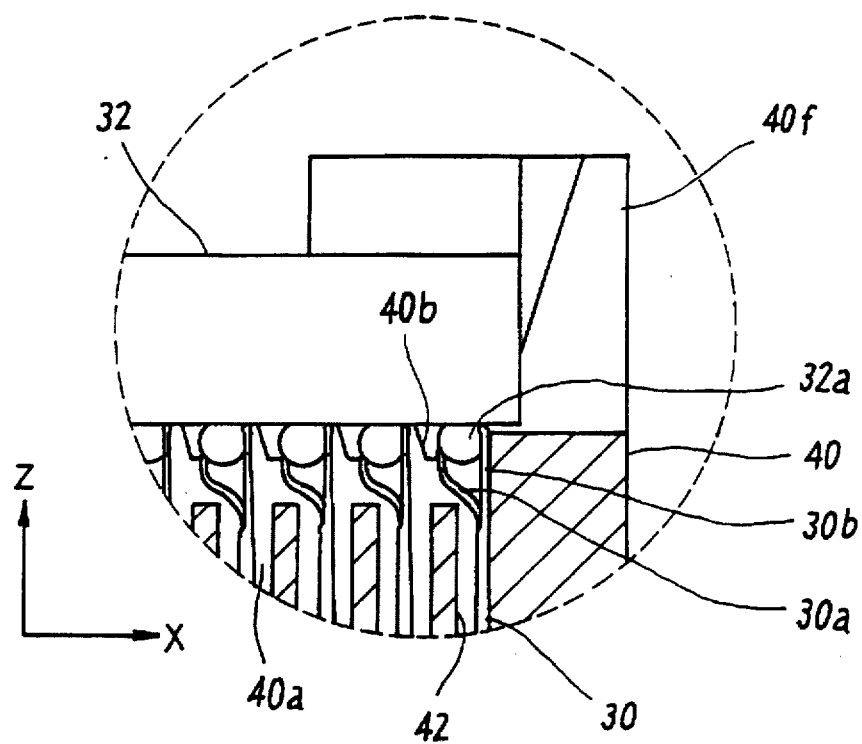
FIG. 31 is an enlarged view of a portion of FIG. 30(A)
Figure 32:
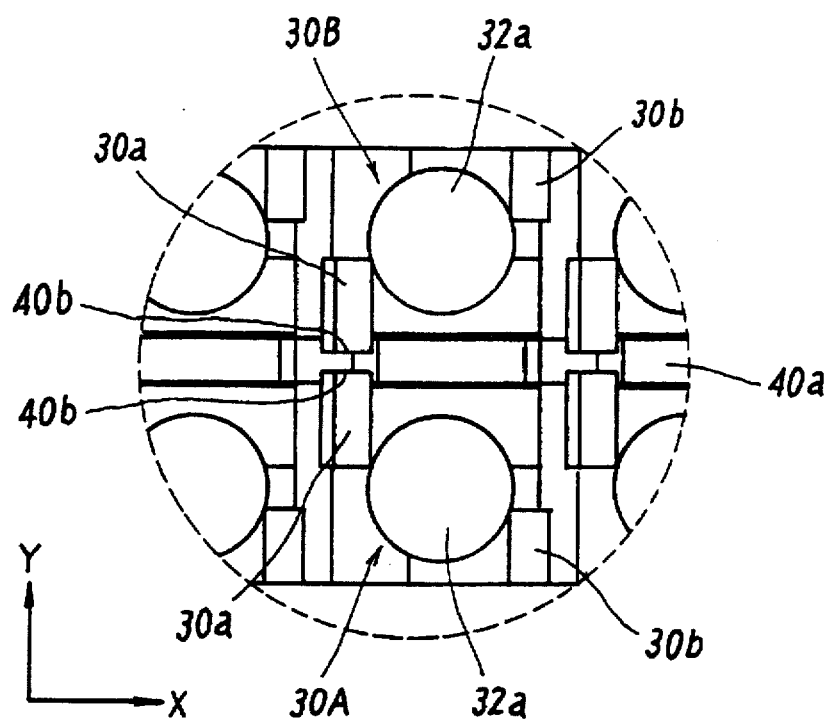
FIG. 32 is an enlarged top view showing the typical positional relationship between lead terminals (solder ball) in the socket and a pair of arms of respective contact elements in the state shown in FIG. 30.
Figure 33:
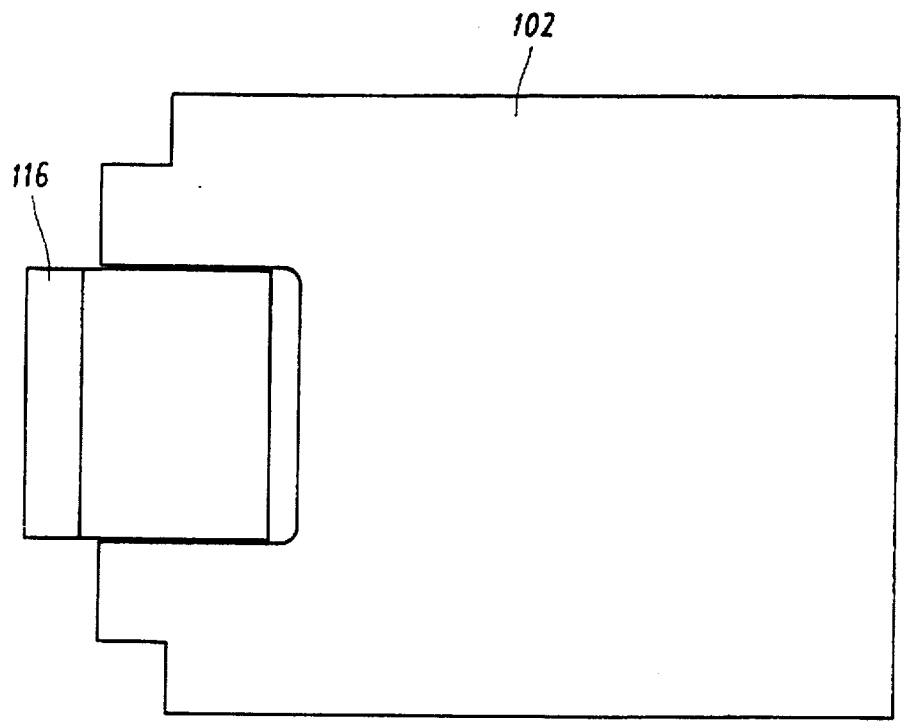
FIG. 33 is a plan view showing the structure of a socket for a bun-in test according to the prior art for loading a BGA package.
Figure 34:
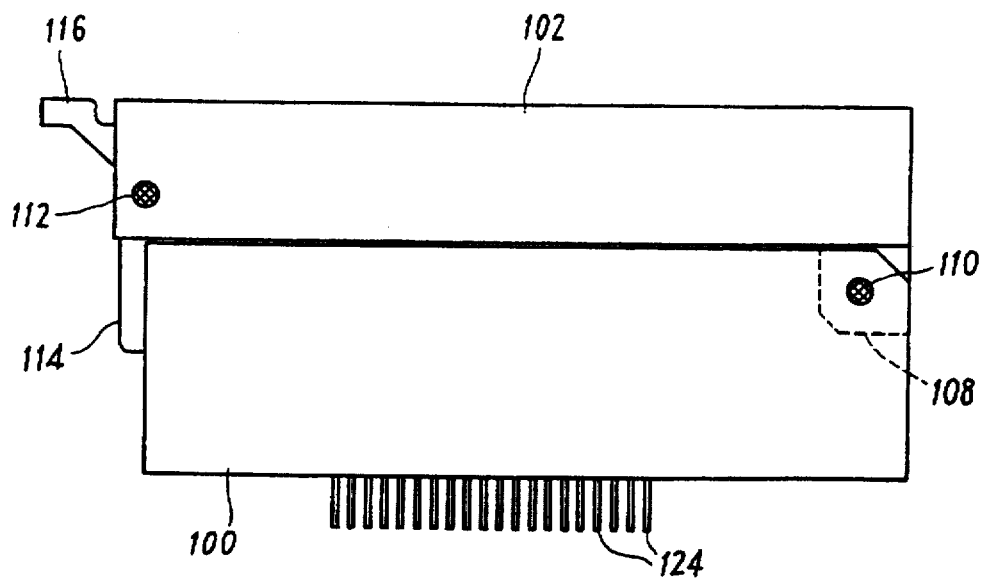
FIG. 34 is a side view of the FIG. 33 sockets.
Figure 35:
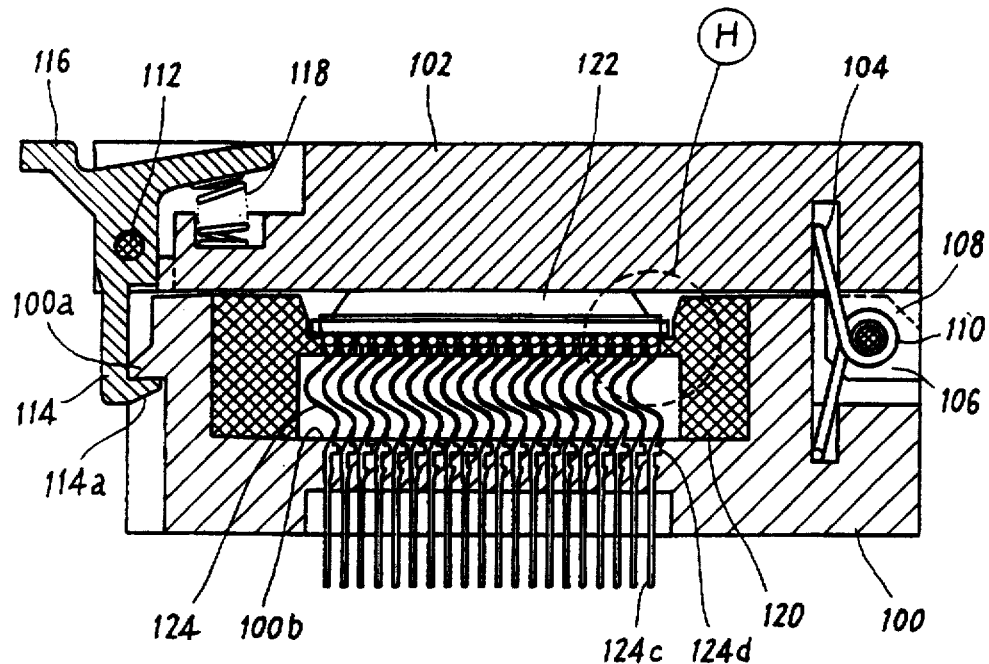
FIG. 35 is a cross sectional view of the FIGS. 33, 34 socket.
Figure 36:
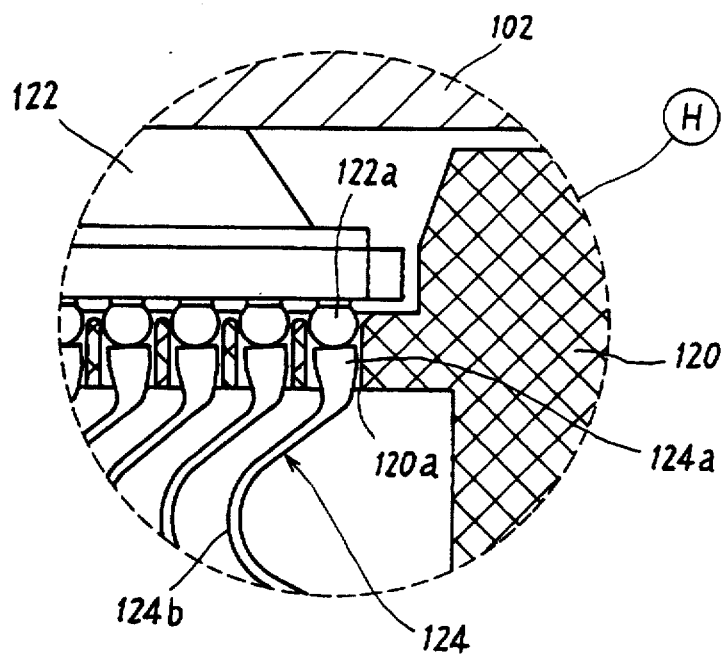
FIG. 36 is an enlarged view of a portion of FIG. 35 denoted by dashed lines H.

FIGS. 30 through 32 show the state in which cover 12 has moved to the position of its upper limit, with FIGS. 30(A)

and (B) being partial cross sections showing the construction of the interior of the socket at that time, FIG. 31 being an enlarged view of the essential part of what is shown in FIG. 30(A) and FIG. 32 being an enlarged view showing the typical positional relationship between lead terminals (solder ball) 32a and arms 30a and 30b of respective contact elements 30.

When cover 12 reaches the position of its highest limit, slide plate 40 slides in the X+ direction due to the spring force of the compression coil spring 46 and returns to the vicinity of its original position and both arms 30a and 30b of each contact element 30 close in such a manner as to hold a respective solder ball 32a from opposite sides, with a result that an electrical connection is obtained by the compressive engagement between each contact element 30 and a respective solder ball 32a. Latch 70 elastically presses BGA package 32 from above as shown in FIG. 30(B). The BGA package 32 receives a burn-in test in the state of being loaded in the socket in the manner described above.

When BGA package 32 is to be taken out of the socket, it is only necessary to press cover 12 down once again to the height shown in FIGS. 24(A) and (B). Thereupon, the various movable parts in the socket move in an opposite direction, both arms 30a and 30b of each contact element 30 separate from their respective solder ball 32a, each latch 70 moves outwardly and its package holding part 70a is separated from the BGA package 32. At this point, it becomes possible to pick out the BGA package 32 with a pair of tweezers or the like. It will be seen that not only the loading and unloading of the BGA package 32 but also the operation of cover 12 (downward force and the removal of the force) involve actions only in the vertical direction. Therefore, a series of these operations can be easily carried out using an automatic unit.

Arms 30a and 30b are offset from another a slight distance in the Y direction and are each movable in the X direction so that an imaginary line drawn through the locations of their engagement with a respective solder ball 32a is not parallel to the X direction. This arrangement facilitates piecing of the surface oxide film of the solder ball 32a by the inner edge of each arm 30a and 30b of contact element 30 which hold the respective solder balls 32a from opposite sides as shown in FIG. 32 in the socket described in this embodiment. As a result, there is obtained a satisfactory electrical engagement between contact element 30 and the respective solder ball 32a.

In view of the fact that the positional relationship of contact elements 30A and 30B are symmetrical with each other with arms 30a and 30b of contact elements 30A being positioned 180 degrees relative to arms 30a and 30b of contact elements 30B which are adjacent to each other in the Y direction, the rotary force given to each solder ball 32 by the compressive contact with a respective contact element 30 cancel one another so that there is no danger for the position of the solder balls 32a through the BGA package 32 being shifted.

In addition, each contact element 30 effects a compressive engagement in such a manner as to hold the side of the solder ball from opposite sides by a pair of arms 30a and 30b without engaging the bottom of the ball as shown in FIG. 31. According to the contacting method whereby the contact element engages opposite sides of the solder ball 32a in this manner, there are obtained such benefits as shown below: there is no danger for the bottom of each solder ball 32a to be damaged or deformed; a constant pressure is obtained even when there is a variation in the thickness of the BGA package; there is no danger of the chip or wiring inside the package to be damaged because the BGA package does not receive a force in a direction which is perpendicular to the surface of the package; stable electrical properties in terms of contact resistance and inductance are obtained as the contact element 30 and the respective solder ball 32a engage each other at two points; and the stress that each contact element 30 receives is small since both arms 30a and 30b of each contact element 30 effect a compressive engagement with each solder ball 32a by a displacement on its way to returning from the fully open state of the maximum displacement to its original state.

Additionally, the conductor distance between each solder ball 32a and the printed substrate is reduced and satisfactory electrical properties including resistance, inductance, and the like of the contact element 30 itself are obtained inasmuch as the contact element 30 is formed approximately in a straight line in the socket in this embodiment.

As the top surface of the BGA package 32 that has been loaded in the socket is exposed to outside air through opening 14 on cover 12, the heat that has been generated inside the BGA package 32 can be effectively dissipated. In addition, cover 12 has a mechanism whereby it moves up and down relative to the base 10 and the latch 70 for holding the BGA package 32 acts in dependence upon the vertical movement of cover 12, with a consequence that there are such advantages as minimization of a need for space and a simplification of the device construction for causing an automatic unit to carry out the loading and unloading of the BGA package.

In the socket of this example, moreover, contact elements 30 are not fixed to the base 10 by the compression method but instead are detachably fixed to base 10 by means of a stop member 36 having apertures 36a provided with protuberances 36b provided on the lower surface of base 10 as described in connection with FIGS. 6 and 7. Therefore, it becomes easier to install or replace contact elements 30.

In the embodiment described, an explanation has been given of a socket which is suitable for use in a burn-in test for the loading of a BGA package 32 that has a lead terminal pattern as shown in FIG. 4(C). However, this invention is not to be limited to such a socket construction but can be transformed or modified variously within the range of its technical concept.

It is also possible to modify the shape of contact element 30 in various ways. If desired, one (such as 30b) of arms 30a and 30b may be eliminated or some suitable reinforcing part may be added. Even the engagement structure between contact element 30 and the stop member 36 can be changed and the engagement structure between an arm 30a of contact element 30 and the slide plate 30 can also be modified.

The contact part opening and closing mechanism which causes each contact element 30 to compressively engage the lead terminal 32a in linkage with the vertical movement of cover 12 also can be modified. For example, the second lever 52 can be omitted by directly linking the first lever 50 to cover 12. Further, cover 12 can be eliminated by causing some suitable tool directly to work on lever 50 for slide plate 40.

The embodiment described pertains to a socket for a BGA package. However, this invention can be applied to sockets for other kinds of IC packages such as a pin grid array package, an SOJ package and an SOP package, etc. In addition, it can be used for a socket for a "bare" chip.

Moreover, this invention can be used not only for a socket for use in a burn-in test but also for sockets for use in an electrical property test which is designed to examine the input/output characteristics and pulse characteristics of an IC package in a short time period.

As has been explained above, socket apparatus which is suitable for electrical connection between an electric part and a lead terminal and socket apparatus equipped with contact elements with superior electrical properties and durability, in particular, is provided by this invention. The invention also provides a socket apparatus which can safely mount an electric part and which can be electrically connected to each lead terminal without causing undesirable damage or deformation to the interior of the electric part or the lead terminal.

According to the socket of this invention, further, a consistent force between each lead terminal and each respective contact member is provided without being affected by the thickness of the main body of the electric part. In addition, space economization is provided and automation of the loading and unloading of the electric part is facilitated as well as the installation and dismantling of a contact element on the main socket body.

It should be understood that this invention includes all modifications and equivalents of the described embodiment falling within the scope of the appended claims.

What is claimed:

1. Socket apparatus for removably mounting an electric part with a plurality of ball-shaped lead terminals arranged in a selected pattern on said electrical part comprising a base, a plurality of elongated contact elements each having a longitudinal axis mounted in the base with the longitudinal axis extending generally parallel to a Z axis in a pattern extending in X-Y directions perpendicular to the Z axis and to each other corresponding to the selected pattern, each contact element having first and second flexible contact arms movable between open and closed positions, a slide plate having top and bottom generally planar surfaces mounted on the base to slide in an X direction, the slide plate having a plurality of apertures extending through the slide plate between the top and bottom surfaces and arranged in a pattern corresponding to the selected pattern, the first and second contact arms of each contact member received in a respective aperture with one of the first and second contact arms being interconnected with the slide plate to move therewith in the X direction, the socket having an electric part receiving seat with the lead terminals of an electric part disposed in the seat received in respective apertures between respective first and second contact arms and means to move the slide plate between an open contact arms position when the electric part can be inserted into and removed from the seat and a closed contact arms position when the terminal leads of the electric part are engaged by respective first and second contact arms.

2. Socket apparatus according to claim 1 in which the first and second contact arms are spaced from one another in the Y direction and are movable relative to one another in the X direction so that an imaginary line drawn through an electric part terminal lead between the points of engagement with the first and second contact arms is not parallel with the X direction.

3. Socket apparatus according to claim 2 in which the contact elements are rotated on their longitudinal axis 180 degrees in alternate rows of apertures in the Y direction to offset rotational forces applied to the terminal leads as a whole.

4. Socket apparatus according to claim 1 in which a groove is formed in the slide plate adjacent each aperture and the interconnection between the said one of the first and second contact arms and the slide plate comprises a tab extending from a distal end portion of said one of the first and second contact arms which is received in a respective groove.

5. Socket apparatus according to claim 1 in which the bottom generally planar surface of the slide plate is spaced from the base.

6. Socket apparatus according to claim 1 in which the means to move the slide plate comprises a lever mechanism having a generally L-shaped lever member having a portion pivotably mounted in the base, the lever member having an elongated arm extending from the pivotably mounted portion to a distal end portion and a relatively short arm extending upwardly from the pivotably mounted portion at a selected angle from the elongated arm to a motion transfer end disposed on a side of the slide plate in the X direction, a downward force exerted on the distal end of the elongated arm causes the lever member to pivot and transfer the force to the slide plate causing the slide plate to move in the X direction and a spring member mounted on the base and adapted the apply a return force to the slide plate in opposition to the force transferred to the slide plate from the lever member.

7. Socket apparatus according to claim 6 further including a cover mounted on the base and being movable between first and second positions, the cover having a motion transfer surface to apply a downwardly exerted force to the lever mechanism when moved from the first to the second positions.

8. Socket apparatus according to claim 7 in which the cover moves between the first and second positions in a direction parallel to the Z axis and the cover has an opening therethrough to allow loading and removal of an electric part relative to the socket apparatus.

9. Socket apparatus according to claim 6 in which the lever mechanism includes another lever member having a first end pivotably mounted in the base, the said another lever member extending to a distal end having a force transfer surface and having an intermediate portion in which a slot is formed, the distal end portion of the elongated arm of the L-shaped member being slidably connected in the slot.

10. Socket apparatus according to claim 1 further including a stop member having top and bottom surfaces mounted on the base movable between a locking position and an unlocking position, the stop member having a plurality of apertures extending through the stop member between the top and bottom surfaces, the contact elements each having an elongated pin portion received through a respective stop member aperture, a protuberance being formed on each contact element aligned with the stop member aperture and a stop member protuberance being formed in the stop member in each stop member aperture, each stop member protuberance engaging with a respective contact element protuberance preventing upward vertical movement of the respective contact element when the stop member is in the locking position and each stop member protuberance being out of engagement with the respective contact element protuberance when the stop member is in the unlocking position.

11. Socket apparatus according to claim 1 including a cover mounted on the base and being movable between first and second positions, the cover having an opening therethrough to allow loading and removal of an electric part relative to the socket apparatus and latch means comprising spaced spring latches mounted in the base adjacent the electric part seat, the latches each having an electric part holding portion movable in a plane parallel to the top surface of the slide plate over the electric part seat and the cover having a surface portion which biases the spring latches toward the electric part seat with the electric part holding portion disposed over the electric part seat when the cover is in one of the first and second positions and which allows the electric part holding portion of the spring latches to move away from the electric part seat when the cover is in the other of the first and second positions.

12. Socket apparatus for removably mounting an electric part with a plurality of ball-shaped lead terminals arranged in a selected pattern from said electric part comprising a base, a plurality of elongated contact elements each having a longitudinal axis mounted in the base with the longitudinal axis extending generally parallel to a Z axis in a pattern extending in X-Y directions perpendicular to the Z axis and to each other corresponding to the selected pattern, each contact element having a flexible contact arm movable between first and second positions, a slide plate having top and bottom generally planar surfaces mounted on the base to slide in an X direction, the slide plate having a plurality of apertures extending through the slide plate between the top and bottom surfaces and arranged in a pattern corresponding to the selected pattern, the contact arm of each contact member received in a respective aperture interconnected with the slide plate to move therewith in the X direction, the socket having an electric part receiving seat with the lead terminals of an electric part received in respective apertures adjacent a contact arm when the electric part is received in the seat and means to move the slide plate between an open contact arms position when the electric part can be inserted into and removed from the seat and a closed contact arms position when the terminal leads of the electric part are engaged by respective contact arms.

13. Socket apparatus for removably mounting an electric part with a plurality of ball-shaped lead terminals arranged in a selected pattern on said electrical part comprising a base, a plurality of holes formed in the base arranged in a pattern corresponding to the selected pattern, a plurality of elongated contact elements each having a longitudinal axis mounted in a respective hole in the base, a stop member having top and bottom surfaces mounted on the base movable between a locking position and an unlocking position, the stop member having a plurality of apertures extending through the stop member between the top and bottom surface aligned with the contact elements each having an elongated pin portion received through a respective stop member aperture, a protuberance formed on each contact element and a stop member protuberance formed in the stop member in each stop member aperture, each stop member protuberance engaging with a respective contact element protuberance preventing upward vertical movement of the respective contact element when the stop member is in the locking position and each stop member protuberance being out of engagement with the respective contact element protuberance when the stop member is in the unlocking position.

* * * * *